(12) United States Patent
Kitamura

(10) Patent No.: US 7,651,284 B2
(45) Date of Patent: Jan. 26, 2010

(54) DEVELOPMENT APPARATUS AND DEVELOPMENT METHOD

(75) Inventor: Tetsuya Kitamura, Koshi (JP)

(73) Assignee: Tokyo Electron Limited, Tokyo (JP)

(*) Notice: Subject to any disclaimer, the term of this patent is extended or adjusted under 35 U.S.C. 154(b) by 558 days.

(21) Appl. No.: 11/559,112

(22) Filed: Nov. 13, 2006

(65) Prior Publication Data
US 2007/0065145 A1    Mar. 22, 2007

Related U.S. Application Data

(63) Continuation of application No. PCT/JP2005/008995, filed on May 17, 2005.

(30) Foreign Application Priority Data
May 18, 2004  (JP) ............................. 2004-148115

(51) Int. Cl.
*G03D 5/00*  (2006.01)
(52) U.S. Cl. .................................. 396/611; 396/564
(58) Field of Classification Search ............... 396/564, 396/604, 611
See application file for complete search history.

(56) References Cited

U.S. PATENT DOCUMENTS 5,437,733 A    8/1995  Okumura 7,435,021 B2 * 10/2008  Sasayama .................. 396/564
2007/0031145 A1 *  2/2007  Kitano et al. ............... 396/611

FOREIGN PATENT DOCUMENTS

| JP | 61-276321 A | 12/1986 |
| JP | 4-154122 A | 5/1992 |
| JP | 6-310419 A | 11/1994 |
| JP | 7-326554 A | 12/1995 |
| JP | 11-150064 A | 6/1999 |
| JP | 2002-15983 A | 1/2002 |
| JP | 2003-100589 A | 4/2003 |

* cited by examiner

*Primary Examiner*—Rodney E Fuller
(74) *Attorney, Agent, or Firm*—Oblon, Spivak, McClelland, Maier & Neustadt, L.L.P.

(57) ABSTRACT

A development apparatus has a holder which horizontally holds a substrate, a nozzle which supplies a developer to a resist film on the substrate held by the holder, a liquid flow suppressing member whose size in a two-dimensional plane viewing field is equal to or larger than that of the substrate and which has a mesh having many openings and hydrophilic properties with respect to the developer and transmits the developer supplied from the nozzle through the openings of the mesh to form a liquid film of the developer between the mesh and the substrate, and a moving mechanism which movably supports this liquid flow suppressing member, sets the mesh to face the resist film on the substrate and brings the mesh into contact with a surface of the liquid film of the developer or immerges the mesh in the liquid film.

20 Claims, 16 Drawing Sheets

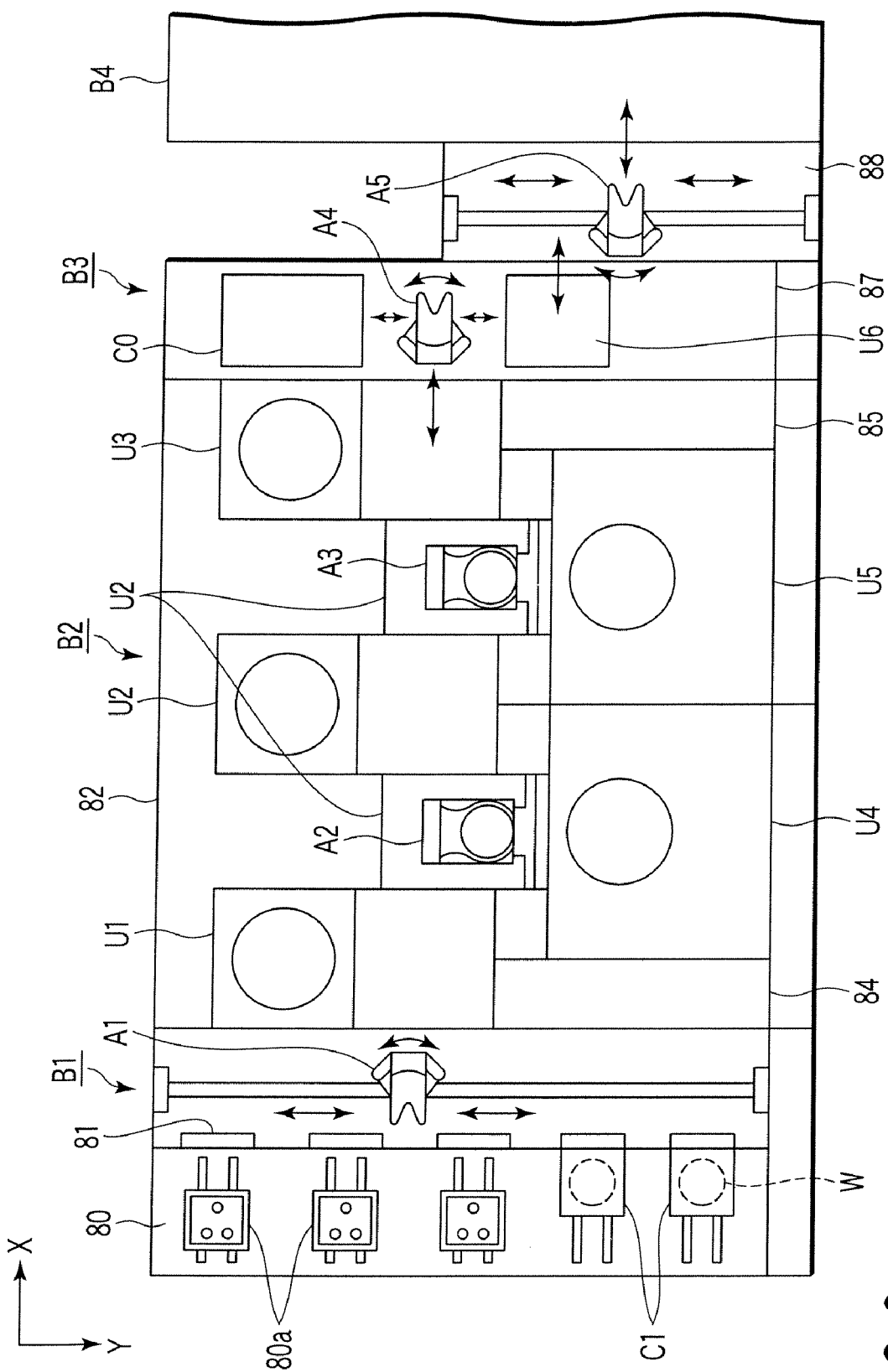
F I G. 2

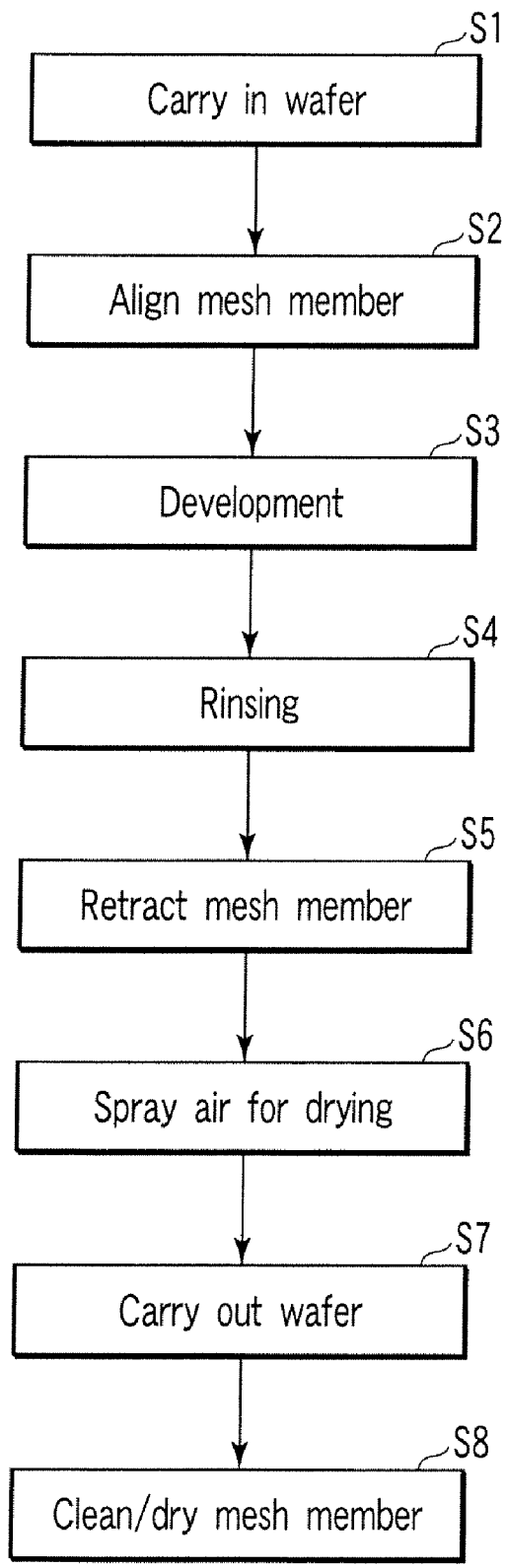
F I G. 10

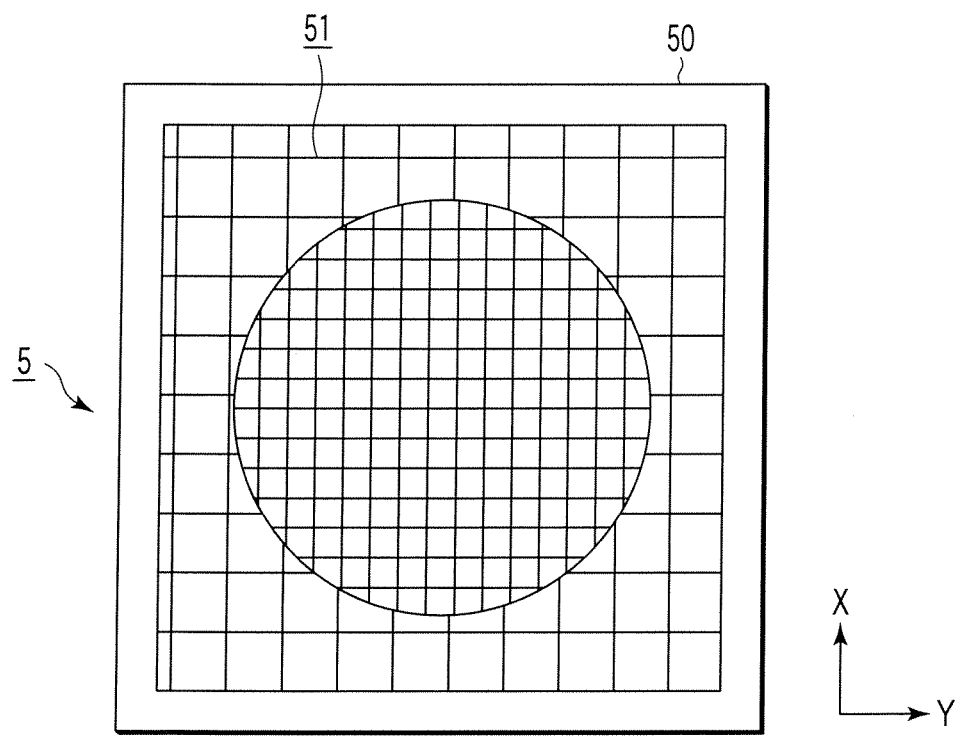
F I G. 17
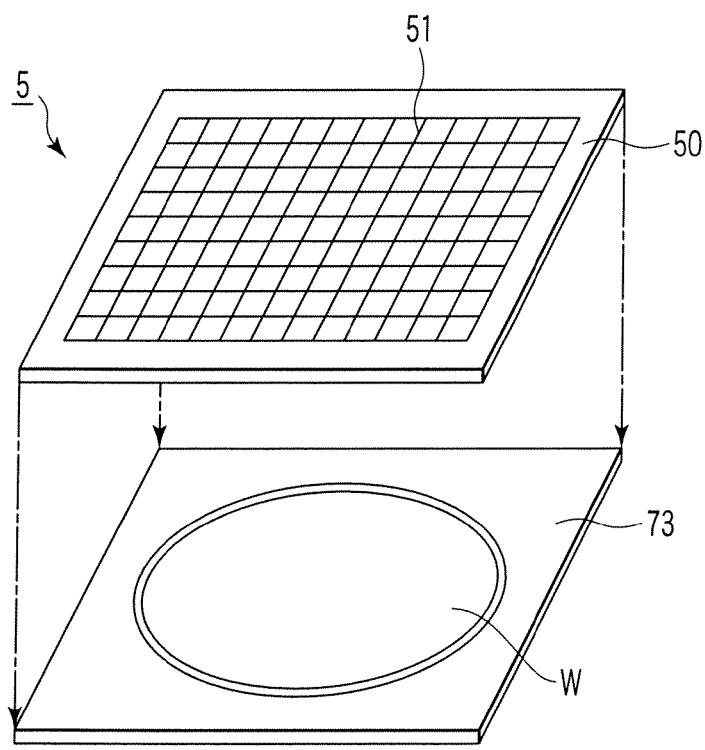
F I G. 18

DEVELOPMENT APPARATUS AND DEVELOPMENT METHOD

CROSS REFERENCE TO RELATED APPLICATIONS

This is a Continuation Application of PCT Application No. PCT/JP2005/008995, filed May 17, 2005, which was published under PCT Article 21(2) in Japanese.

This application is based upon and claims the benefit of priority from prior Japanese Patent Application No. 2004-148115, filed May 18, 2004, the entire contents of which are incorporated herein by reference.

BACKGROUND OF THE INVENTION

1. Field of the Invention

The present invention relates to a development apparatus and a development method which develop a resist coating film subjected pattern exposure.

2. Description of the Related Art

In a photolithography process for a semiconductor device, a system in which a coating/development apparatus is combined with an exposure device is used. A development nozzle of the coating/development apparatus is provided with a linear discharge opening which is equal to or longer than a diameter of a semiconductor wafer W in order to improve uniformity of processing. The development nozzle is arranged in such a manner that this linear discharge opening is placed in close proximity to a resist coating film on the wafer W, a developer is discharged toward the wafer W which is in a static state, and the development nozzle is moved for scanning from one end side toward the other end side of the wafer W. As a result, a liquid film of the developer having a thickness of, e.g., approximately 3 mm is formed on the resist coating film. When a state in which the liquid film of this developer is mounted is maintained for a predetermined time, the resist coating film is developed (static development), and a predetermined circuit pattern is formed. Then, the wafer W is cleaned with a rinse agent and dried.

Meanwhile, in a period that the developer is present on the wafer W, the developer already existing on the wafer and the new developer which has been just discharged from the nozzle are coupled with each other by a function of the surface tension. At this time, since the nozzle is in a moving state whilst the wafer W is in the static state, a liquid flow (of small flow rate) may be produced in the liquid film of the developer on the wafer W due to a swing-back movement (a function of an inertial force) of the developer in some cases. When this liquid flow is generated in the developer on the wafer W, slight unevenness is generated in a developer concentration (a concentration of a resist dissolving component) in a wafer plane. As a result, since progress of a development reaction becomes non-homogeneous in the wafer plane and unevenness is produced in a resist resolution, there is a risk of a reduction in uniformity of a pattern line width which is finally formed in the wafer plane.

As one technique which suppresses such a liquid flow in a liquid film of a developer, there has been proposed Jpn. Pat. Appln. KOKAI Publication No. 2003-100589 (see paragraphs 0015 to 0018, FIG. 4). In this conventional technique, a plate 12 having a plurality of holes 11 formed therein is arranged to face a wafer W, and a developer is supplied onto the wafer W through these holes 11. According to this technique, since a swing-back movement of the developer occurs on the plate 12 which is in a static state, a liquid flow of the developer is not generated on the wafer W.

However, this conventional technique has the following problems.

The plurality of holes 11 may include holes 11 through which the developer is not transmitted due to a function of the surface tension in some cases. Therefore, as seen from a plane of the plate 12, there are formed a distribution of holes 11 through which the developer is transmitted and the holes 11 through which the developer is not transmitted, whereby a liquid film of the developer having a uniform thickness cannot be formed on the wafer W plane in some cases. Unevenness in line width accuracies caused due to such non-uniformity of the thickness of the developer has not been regarded as a problem in particular. In recent years, however, with further advancement of miniaturization of a device circuit, demand from users for forming a detailed pattern with a thinner line width has increased.

BRIEF SUMMARY OF THE INVENTION

It is an object of the present invention to provide a development apparatus and a development method which can form a liquid film of a developer having a thickness with high in-plane uniformity on a substrate while suppressing generation of a liquid flow in the liquid film of the developer when supplying the developer onto a coating film on the substrate.

A development apparatus which develops a resist coating film subjected to pattern exposure on a substrate, characterized by comprising: a substrate holding portion which substantially horizontally holds the substrate in such a manner that the resist coating film is placed on an upper side; a development nozzle which supplies a developer to an upper surface of the substrate held by the substrate holding portion; a liquid flow suppressing member whose size in a two-dimensional plane viewing field is equal to or larger than that of the substrate, and which has a mesh having many openings and hydrophilic properties with respect to the developer, transmits the developer supplied from the development nozzle through the openings of the mesh, and forms a liquid film between the mesh and the substrate; and a moving mechanism which movably supports the liquid flow suppressing member, sets the mesh to face the resist coating film on the substrate, and brings the mesh into contact with the surface of the liquid film of the developer or immerses the mesh in the liquid film.

A contact angle of the developer with respect to the mesh of the liquid flow suppressing member may be, e.g., less than 30 degrees. Further, the coating liquid applied to the surface of the substrate to which the developer is fed has water-shedding properties with respect to the developer, and a thickness of the developer formed on the surface of the substrate may be 0.5 to 3 mm.

Furthermore, the mesh may have a first mesh portion having hydrophilic properties with respect to the developer, and a second mesh portion which is provided above the first mesh portion and has hydrophilic properties smaller than the first mesh portion. In this case, the contact angle of the developer with respect to the second mesh portion may be not smaller than 70 degrees.

The mesh may have a plurality of first wires arranged at intervals in a first direction and a plurality of second wires arranged at intervals in a second direction to cross the first wires, and a diameter of each of the first wires is larger than that of each of the second wires.

The mesh may have a group of a plurality of first wires arranged at intervals in a first direction and a group of a plurality of second wires arranged at intervals in a second direction to cross the first wires, and large-diameter wires having a large wire diameter are included in one or both of the first and second wire groups, and each large-diameter wires is arranged every predetermined number of wires.

The openings of the mesh on a side which does not face the substrate may be larger than openings of the same on a side facing the substrate.

Moreover, there is provided a small auxiliary plate to surround an outer periphery of the substrate held in the substrate holding portion and has smaller hydrophilic properties with respect to the developer at least than the mesh. In this case, it is preferable for a contact angle of developer with respect to the auxiliary plate to be 40 to 70 degrees.

Additionally, it is preferable to have cleaning means for cleaning the liquid flow suppressing member. The liquid flow suppressing member can be always kept in a clean state by cleaning the liquid flow suppressing member by using the dedicated cleaning means.

A development method which develops a resist coating film subjected to pattern exposure on a substrate, characterized by comprising: (a) substantially horizontally holding the substrate in such a manner that the resist coating film is placed on an upper side; (b) preparing a liquid flow suppressing member whose size in a two-dimensional plane viewing field is equal to or larger than that of the substrate and which has a mesh having many openings and hydrophilic properties with respect to the developer, and adjusting a position of the liquid flow suppressing member with respect to the substrate; and (c) transmitting the developer through the openings of the mesh, forming a liquid film of the developer between the mesh and the substrate, and holding a state in which the mesh is in contact with a surface of the liquid film of the developer or is immersed in the liquid film for a predetermined time, thereby developing the resist coating film.

In step (b), a supply amount of the developer can be adjusted in such a manner that a thickness of the liquid film of the developer becomes 0.5 to 3 mm, and a position of the liquid flow suppressing member can be adjusted with respect to the substrate.

Further, after step (c), the liquid flow suppressing member can be cleaned by using a rinse agent, and the rinse agent can be removed from the liquid flow suppressing member by spraying a drying gas.

Furthermore, after step (c), the substrate can be cleaned by using the rinse agent, and the rinse agent can be removed from the substrate by spraying the drying gas.

At the time of cleaning the liquid flow suppressing member by using a rinse agent, spraying a drying gas to remove the rinse agent from the liquid flow suppressing member, cleaning the substrate with the rinse agent and spraying the drying gas to remove the rinse agent from the substrate after step (c), the method further comprises simultaneously performing removal of the rinse agent from the liquid flow suppressing member and removal of the rinse agent from the substrate.

Spraying a drying gas to remove the developer from the substrate, cleaning the substrate by using a rinse agent and further spraying the drying gas to the substrate to remove the rinse agent from the substrate after step (c).

The resist coating film is covered with a protection film and subjected to immersion before step (a). In this case, the liquid flow suppressing member can be utilized to remove the protection film before step (c).

According to the present invention, since there is adopted a structure in which the liquid flow suppressing member including the mesh having the hydrophilic properties with respect to the developer is provided at a height position where this member comes into contact with a surface of the developer supplied to the substrate or it is immersed in the liquid, it is possible to suppress generation of a liquid flow phenomenon (flowage) in the liquid film of the developer existing in a gap between the substrate and the liquid flow suppressing member. Moreover, since provision of the hydrophilic properties can improve wettability of the developer and the developer can be thereby uniformly transmitted within a plane of the liquid flow suppressing member, the liquid film of the developer having a uniform thickness can be formed on the surface of the substrate. As a result, a mask pattern having high in-plane uniformity with respect to a line width can be formed on the surface of the substrate after development.

BRIEF DESCRIPTION OF THE SEVERAL VIEWS OF THE DRAWING

FIG. 2 is a plan view showing an outline of a coating/development apparatus.

FIG. 10 is a flow chart showing a development method according to the present invention.

FIG. 17 is a plan view showing the liquid flow suppressing member according to another embodiment.

FIG. 18 is a perspective view showing the liquid flow suppressing member according to another embodiment.

DETAILED DESCRIPTION OF THE INVENTION

Preferred embodiments according to the present invention will now be described hereinafter with reference to the accompanying drawings.

Figure 1:
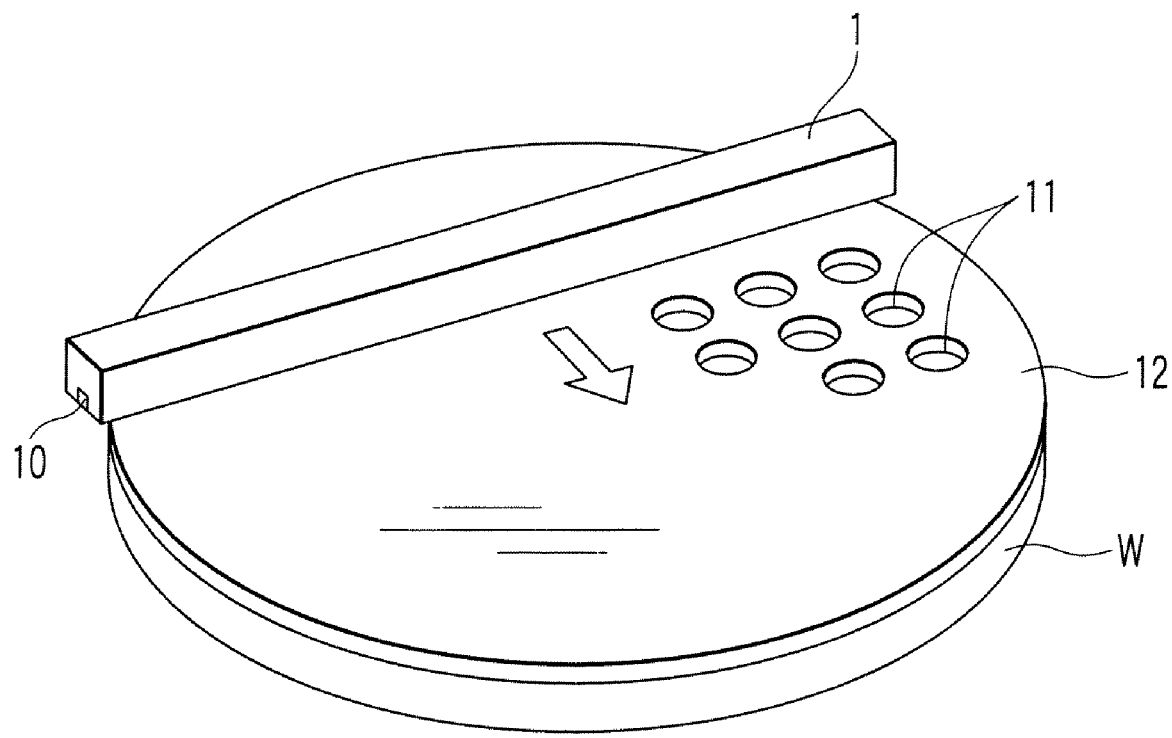
FIG. 1 is a perspective view showing an outline of a conventional development method.
Figure 3:
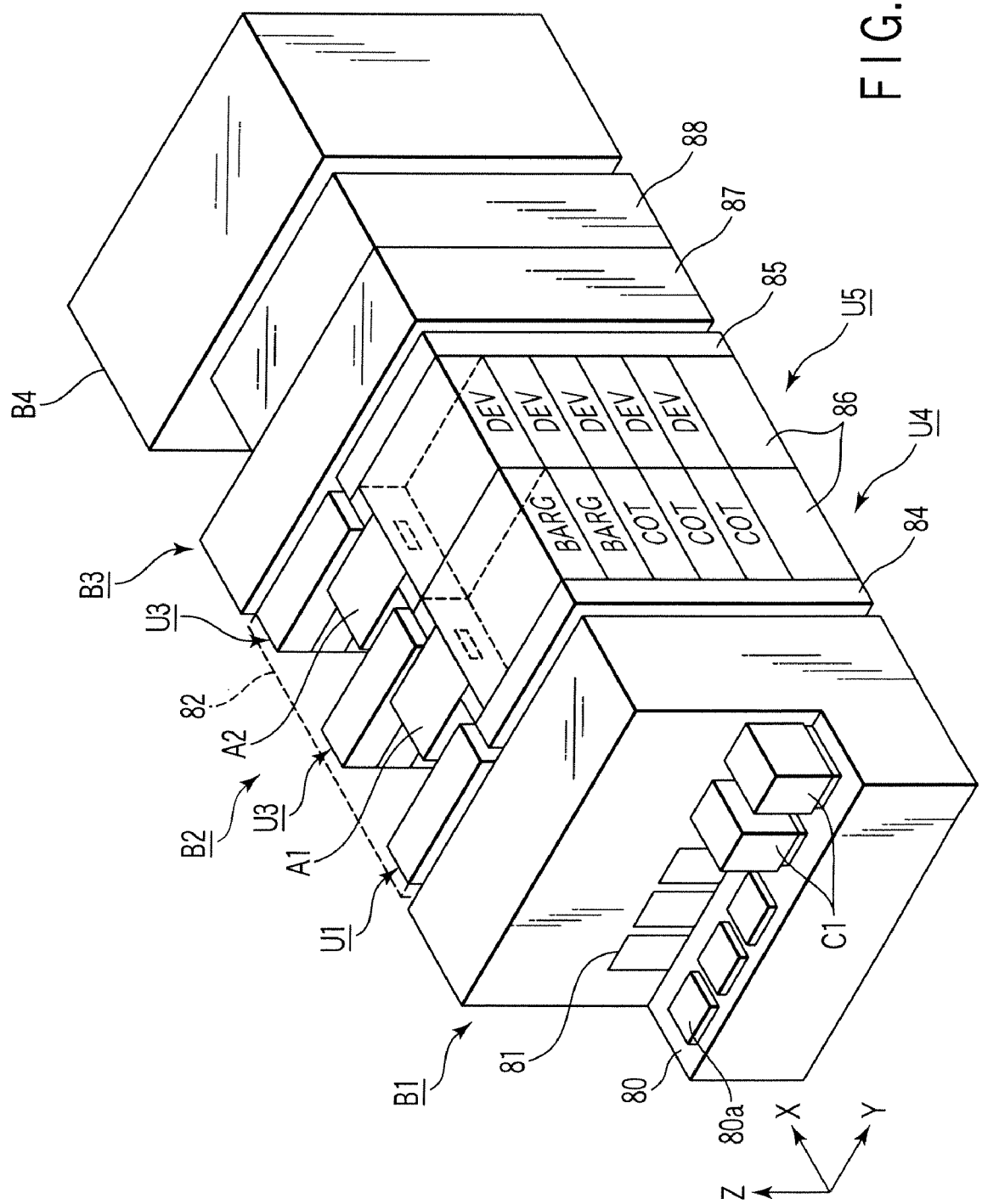
FIG. 3 is a perspective view showing an outline of the coating/development apparatus.

A development apparatus according to the present invention is incorporated as a development unit DEV in a coating/development apparatus shown in FIGS. 2 and 3. Reference character B1 in the drawing denotes a carrier mount portion which carries in and out a carrier C in which, e.g., 13 semiconductor wafers W are accommodated. The carrier mount portion B1 is provided with a carrier station 8 including a mount portion 80 in which the plurality of carriers C can be mounted, opening/closing portions 81 provided on a wall surface on a front side as seen from the carrier station 8, and a sub-carriage arm mechanism Al which is used to take out the wafer W from the carrier C through each opening/closing portion 81.

A processing portion B2 is connected on the innermost side of the carrier mount portion B1 in an X direction, and the processing portion B2 is surrounded by a case body 82. In this processing portion B2 are alternately aligned and provided shelf units U1, U2 and U3 in which heating/cooling system units are stacked on multiple stages and main carriage arm mechanisms A2 and A3 which deliver the wafer W between the respective processing units including a later-described coating/development unit in the order from the carrier mount portion B1 side. That is, the shelf units U1, U2 and U3 and the main carriage arm mechanism A2 and A3 are aligned and arranged in series in the X direction, and wafer carriage opening portions (not shown) are formed at connecting portions between the respective units U1, U2 and U3 so that the wafer W can be freely moved from the shelf unit U1 on one end side to the shelf unit U3 on the other end side in the processing portion B1 through these opening portions. Further, the main carriage arm mechanisms A2 and A3 are placed in a space surrounded by a partition wall 83 constituted of one surface portion on the shelf units U1, U2 and U3 arranged at front and rear positions in the X direction, one surface portion on the later-described liquid processing units U4 and US on, e.g., a right-hand side and a rear surface portion forming one surface on a left-hand side. It is to be noted that reference numerals 84 and 85 in the drawing denote a temperature adjustment device for a processing liquid used in each unit or a temperature and humidity adjustment unit including a duct or the like for temperature and humidity adjustment.

As shown in FIG. 3, each of the liquid processing units U4 and US has a structure in which a coating unit COT, a development unit DEV and an antireflection film formation unit BARC are stacked on, e.g., five stages above a chemical accommodating portion 86 in which a chemical such as a coating liquid (resist liquid) or a developer is stored. Furthermore, each of the shelf units U1, U2 and U3 has a structure in which various kinds of units required to effect pre-processing or post-processing executed in the liquid processing unit U4 or U5 are stacked on a plurality of stages, e.g., 10 stages, and its combination includes a heating unit which heats (bakes) the wafer W, a cooling unit which cools the wafer W and others.

An exposure portion B4 is connected to the innermost side of the shelf unit U3 in the processing portion B2 through an interface portion B3 consisting of, e.g., a first carriage chamber 87 and a second carriage chamber 88. In the interface portion B3 are provided two delivering means A4 and A5 which deliver the wafer W between the processing portion B2 and the exposure portion B4 as well as a shelf unit U6 and a barrier carrier C2.

An example of a flow of the wafer W in the coating/development apparatus will now be briefly described.

First, when the carrier C1 is mounted on the mount base 80 from the outside, a lid body of the carrier C1 is removed together with the opening/closing portion 81, and the wafer W is taken out by the sub-carriage arm mechanism A1. Then, the wafer W is delivered to the main carriage arm mechanism A2 through a delivering unit (not shown) forming one stage of the shelf unit U1, and, e.g., antireflection film formation processing and cooling processing are executed as pre-processing of coating processing in one shelf of the shelf units U1 to U3. Subsequently, when a resist film is formed by the coating unit COT, the wafer W is baked and heated by the heating unit forming one shelf of the shelf units U1 to U3, then cooled and carried into the interface portion B3 through the delivering unit of the shelf unit U3. In this interface portion B3, the wafer W is carried into the exposure portion B4 along a path constituted of, e.g., the delivering means A4, the shelf unit U6 and the delivering means A5 in the mentioned order, thereby subjecting the resist coating film to pattern exposure. After exposure, the wafer W is carried to the main carriage arm mechanism A2 in a reverse path, and developed in the development unit DEV. After development, the wafer W is cleaned/dried, carried by the main carriage arm mechanisms A2 and A3, and returned into the original carrier C1 on the mount base 80 by the sub-carriage arm mechanism A1.

The development apparatus according to the embodiment of the present invention will now be described with reference to FIGS. 4 to 9.

Operations of various kinds of mechanisms 28, 32, 35, 53A, 53B, 121, 132 and 134 in the development apparatus are collectively controlled by a controller 90 having a database storing, e.g., a process recipe. Moreover, various kinds of sensors (not shown) which output a temperature, humidity, a pressure and a position are disposed at respective places in the development apparatus, and detection signals are supplied to the controller 90 from the respective sensors.

Figure 4:
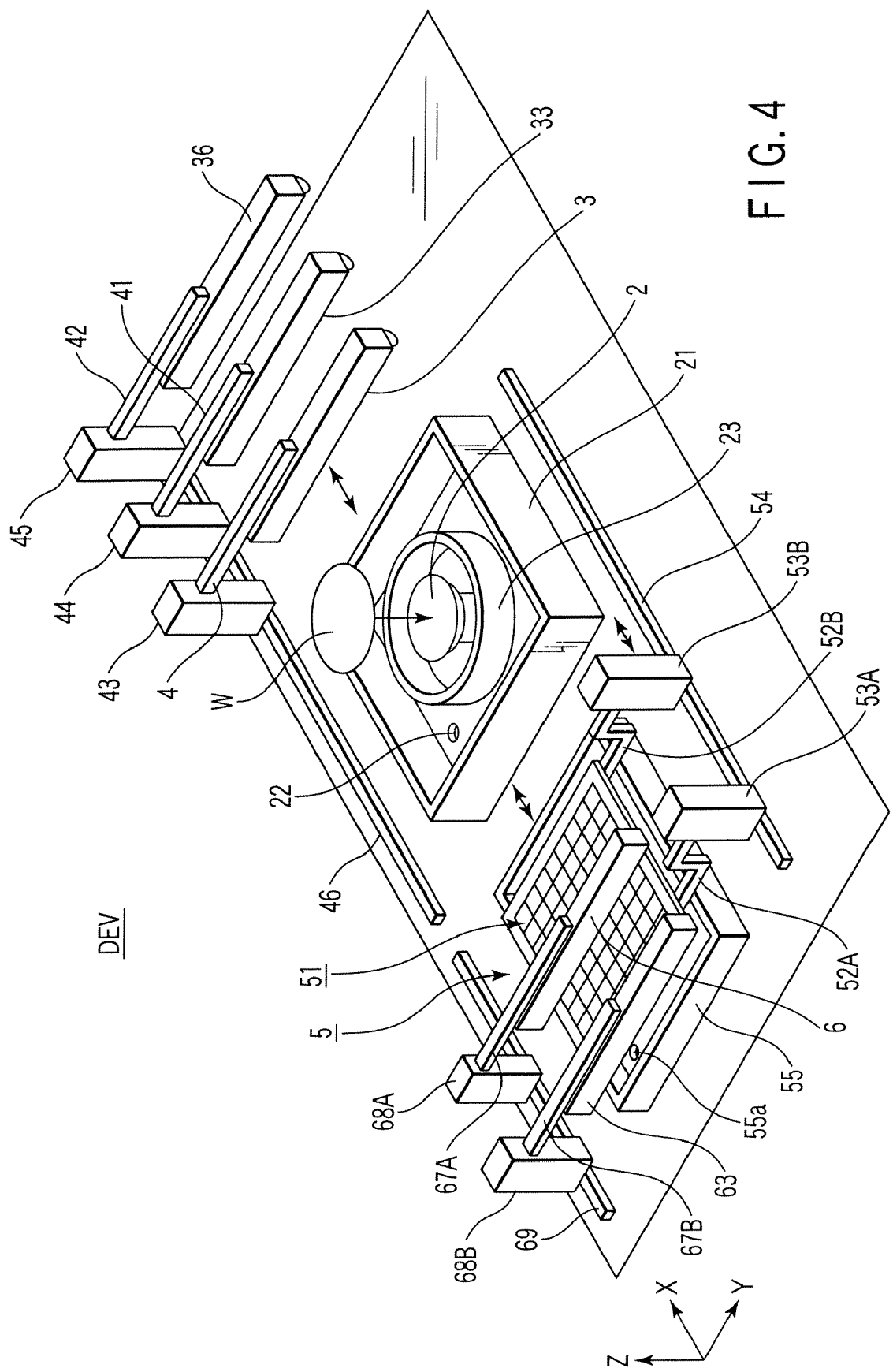
FIG. 4 is a perspective view showing a development apparatus according to the present invention.
Figure 5:
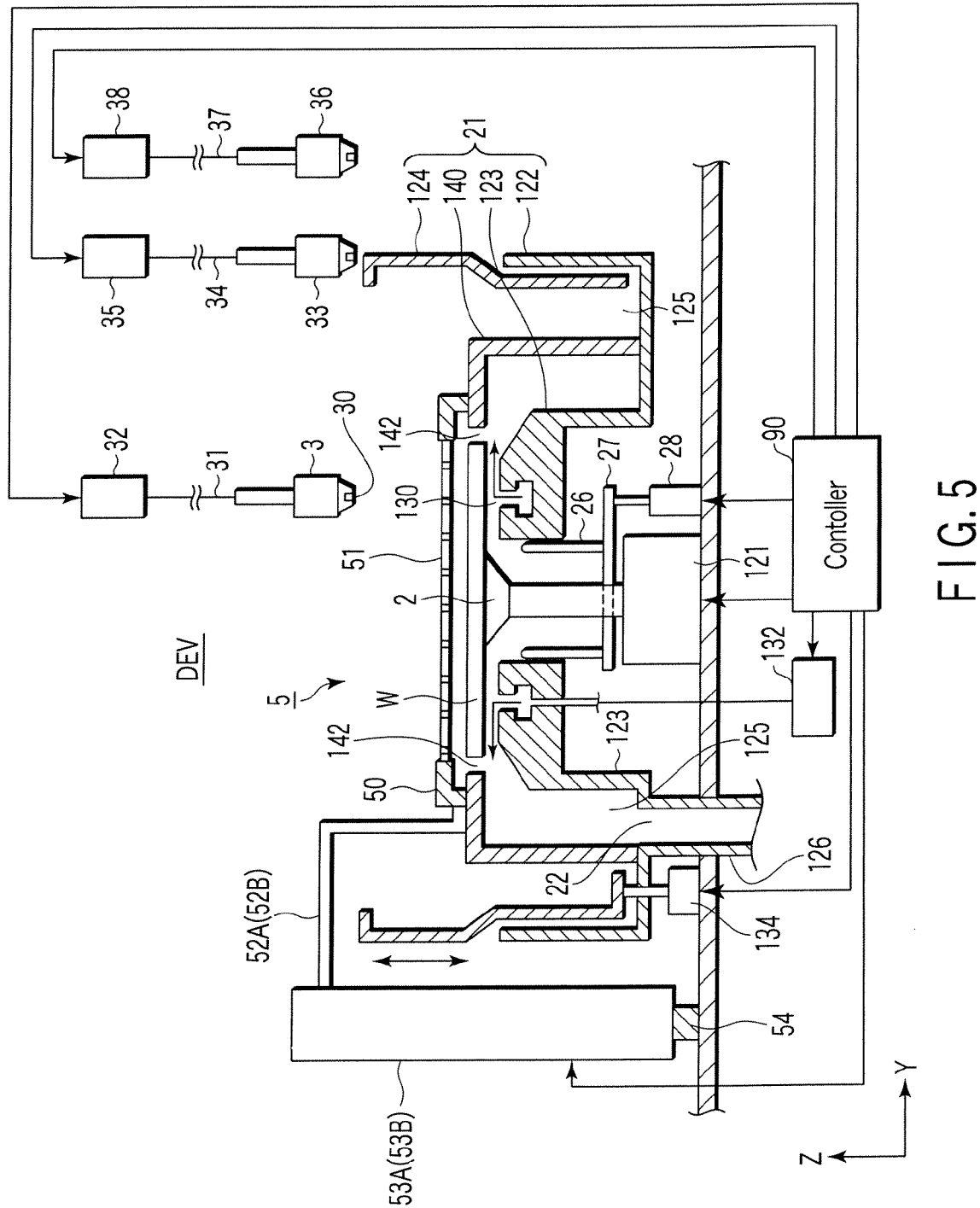
FIG. 5 is a block cross-sectional view showing the development apparatus according to the present invention.

Reference numeral 2 in FIGS. 4 and 5 denotes a vacuum chuck which holds the wafer W in a horizontal attitude. A non-illustrated vacuum hole is formed in an upper surface of the vacuum chuck 2 so that a central part of a rear surface of the wafer W is vacuum-sucked. This vacuum hole communicates with a suction opening of a pump 121 through a suction path.

A box-like rectangular cup assembly 21 (liquid receiving portion) is provided to surround the wafer W held on the vacuum chuck 2 from a lateral side and a bottom side. A discharge opening 22 from which a liquid to be drained such as a developer or a rinse agent running over from the wafer W is discharged is formed in a bottom portion of this cup assembly 21. The cup assembly 21 is provided with a fixed cup 122, an inner peripheral cup 123, an outer peripheral cup 124 and an outer peripheral plate 140. The fixed cup 122 is fixed on a non-illustrated based frame and has the inner peripheral cup 123 therein. As shown in FIGS. 4 and 5, the outer peripheral cup 124 has a substantially square shape in an XY plane and is supported to allow its upward and downward movements by a cylinder 134.

Figure 8:
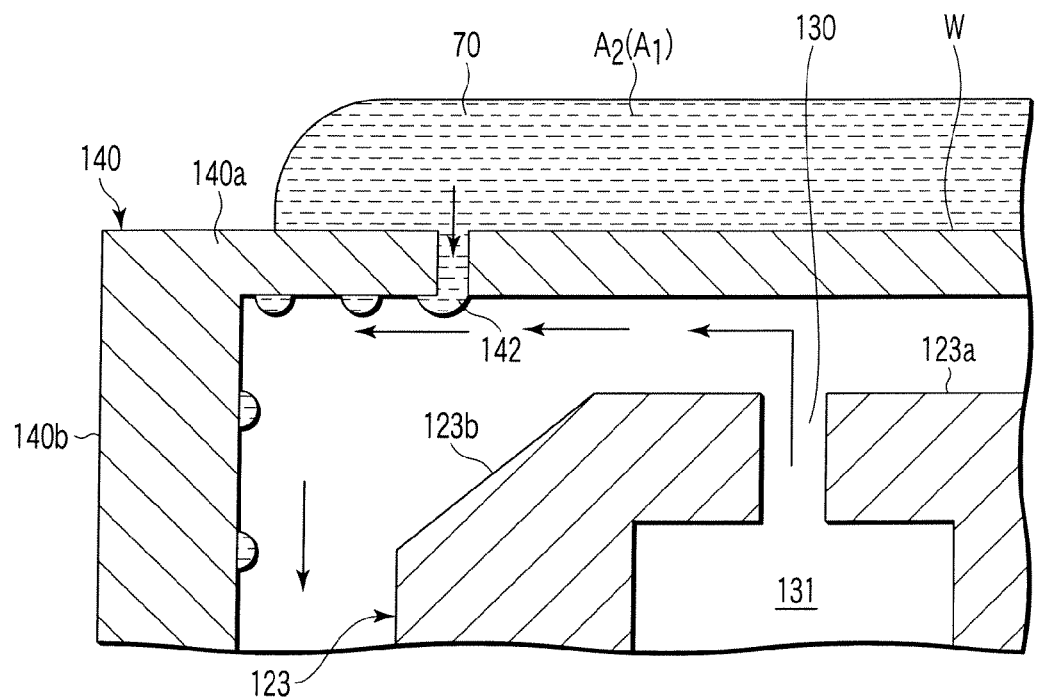
FIG. 8 is a cross-sectional view showing a gas spraying mechanism which avoids running/adhesion of a developer on a rear surface of a substrate.
Figure 9:
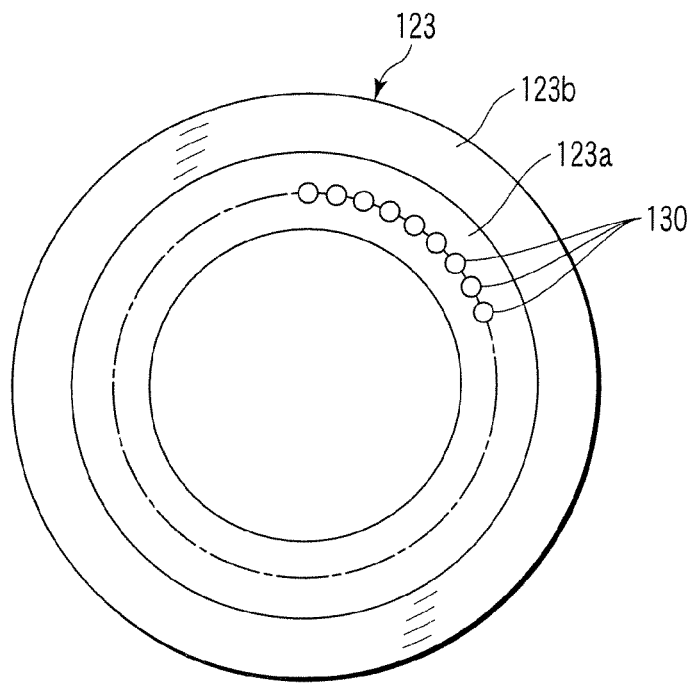
FIG. 9 is a plan view showing the gas spraying mechanism.

As shown in FIG. 8, a horizontal surface 123a parallel with the rear surface of the wafer W and an inclined surface 123b which gradually lowers from an outer end of the horizontal surface 123a toward the outside are formed on an upper surface of the inner cup 123. Each gas spraying opening 130 of a gas spraying mechanism which upwardly sprays a gas is opened in the horizontal surface 123a of the inner peripheral cup 123. The number of gas spraying openings 130 is 60, and a diameter of each gas spraying opening is approximately 1 mm. As shown in FIG. 9, the 60 gas spraying openings 130 are distributed and arranged around the center of a concentric circle of the horizontal surface 123a with a pitch having a central angle of 60°.

As shown in FIG. 5, each gas spraying opening 130 communicates with a header 131 formed into a ring-like shape in the inner peripheral cup 123. The header 131 communicates with a gas supply source 132 through an air supply tube 133. Drying air is accommodated in the gas supply source 132.

An outer peripheral plate 140 is provided outside the wafer W held on the chuck 2. This outer peripheral plate 140 is arranged between the inner peripheral cup 123 and the outer peripheral cup 124. The outer peripheral plate 140 is provided with a horizontal portion 140a positioned on the same plane as (to be level with) the wafer W held on the chuck 2 and a vertical portion 140b downwardly extending from an outer peripheral end of the horizontal portion 140a. These horizontal portion 140a and vertical portion 140b have a role of leading a liquid 70 which is going to run toward the rear surface side of the wafer W through a gap 142 to the drain discharge opening 22 as will be described later. After a pressure of drying air is uniformed in the header 131, drying air is sprayed to the rear surface of the wafer W from the gas spraying openings 130, flows along the rear surface of the wafer W, the outer peripheral plate horizontal portion 140a and the vertical portion 140b in the mentioned order, and finally flows to the outside from the discharge opening 22 through a drain tube 126.

It is to be noted that although the gas spraying mechanism is used to prevent the liquid from adhering to the rear surface of the wafer W in this embodiment, a rear surface cleaning nozzle may be additionally provided so that a rinse agent can be sprayed from the rear surface cleaning nozzle to clean the rear surface of the wafer W. In this case, the gas spraying openings 130 of the gas spraying mechanism can be modified to spray drying air to the entire rear surface of the wafer W in such a manner that drying air is belched out toward the outer side as well as the inner side.

As shown in FIG. 5, for example, three support pins 26 are provided in a hollow portion in the inner peripheral cup 123. These support pins 26 are attached on a movable base 27, and simultaneously moved up and down together with the movable base 27 by the cylinder 28 to deliver the wafer W between the main carriage arm mechanisms A2 and A3.

As shown in FIG. 4, three nozzles 3, 33 and 36 are in a standby mode at home positions apart from the cup assembly 21. The first nozzle 3 is a development nozzle. The second nozzle 33 is a rinse nozzle. The third nozzle 36 is a drying nozzle. These nozzles 3, 33 and 36 are respectively movably supported by moving substrates 43, 44 and 45 through horizontal arms 4, 41 and 42, and can be moved along a guide rail 46 in a section from the home positions to use positions (positions above the cup assembly 21). The guide rail 46 is a linear guide extending in the X direction, and the nozzles 3, 33 and 36 are respectively moved when sliders of the moving substrates 43, 44 and 45 slide on this rail 46.

The development nozzle 3 communicates with a developer supply source 32 through a flexible tube 31 having flexibility, and supported by the moving substrate 43 to allow its movement in X, Y and Z directions. The development nozzle 3 is provided with a linear discharge opening 30 which is equal to or longer than a width of an effective region (device forming region) of the wafer W. The discharge opening 30 may have a structure in which one or more strings of narrow holes are arranged at predetermined pitch intervals or a structure consisting of a slit with a uniform width. The developer supply source 32 includes a non-illustrated pressure control valve therein. Moreover, a non-illustrated mass flow controller (MFC) is provided at an appropriate position of the flexible tube 31 so that a flow quantity of a developer supplied to the nozzle 3 can be controlled. Operations of the pressure control valve, MFC and moving substrate 43 are controlled by the controller 90 as shown in FIG. 5, respectively.

The rinse nozzle 33 communicates with a pure water supply source 35 through a flexible tube 34 having flexibility, and is supported by the moving substrate 44 to allow its movement in the X, Y and Z directions. A discharge opening of the rinse nozzle 33 is also a string of narrow holes like the development nozzle 3. The pure water supply source 35 includes a non-illustrated pressure control valve therein. Additionally, a non-illustrated mass flow controller (MFC) is provided at an appropriate position of the flexible tube 34 so that a flow quantity of pure water supplied to the nozzle 33 is controlled. Operations of the pressure control valve, MFC and moving substrate 44 are also controlled by the controller 90, respectively.

The drying nozzle 36 communicates with a drying air supply source 38 through a flexible tube 37 having flexibility and is supported by the moving substrate 45 to allow its movement in the X, Y and Z directions. A discharge opening of the drying nozzle 36 is also a string of narrow holes like the development nozzle 3. The drying air supply source 38 includes a non-illustrated pressure control valve. Further, a non-illustrated mass flow controller (MFC) is provided at an appropriate position of the flexible tube 37 so that a flow quantity of drying air supplied to the nozzle 36 is controlled. Operations of these pressure control valve, MFC and moving substrate 45 are also controlled by the controller 90 as mentioned above. Drying air is sprayed from the nozzle 36 to blow out and remove the liquid from the upper surface of the wafer W. It is to be noted that a suction nozzle communicating with a pump or an ejector may be used in place of the drying nozzle 36 to suck and remove the liquid from the upper surface of the wafer W.

The development nozzle 3, rinse nozzle 33 and drying nozzle 36 are independently supported on the distal end side of the horizontal arms 4, 41 and 42, respectively. The proximal end sides of the respective arms 4, 41 and 42 are supported by the moving substrates 43, 44 and 45, respectively. Furthermore, each of the respective moving substrates 43, 44 and 45 is provided with a non-illustrated elevating mechanism, and each of the nozzles 3, 33 and 36 is independently moved up and down in the Z direction by the elevating mechanism. Moreover, each of the moving mechanisms 43, 44 and 45 is provided with a non-illustrated slider mechanism engaged with the guide rail 46, and each of the nozzles 3, 33 and 36 is independently slid in the X direction by the slider mechanism. As a result, each of the nozzles 3, 33 and 36 is moved along the guide rail 46 in the section from each home position to each use position. Additionally, each of the moving substrates 43, 44 and 45 is provided with a non-illustrated cylinder mechanism, and each of the nozzles 3, 33 and 36 is independently slid in the Y direction by the cylinder mechanism.

It is to be noted that the three moving substrates 43, 44 and 45 shares the single guide rail 46 in this embodiment, but a dedicated guide rail may be provided to for each of the moving substrates 43, 44 and 45 so that the respective moving substrates 43, 44 and 45 can be slid on the different rails.

As shown in FIG. 4, a liquid flow suppressing member 5 is in a standby mode at a home position apart from the cup assembly 21. This home position is provided on the opposite side of the home positions of the nozzles 3, 33 and 36 with the cub assembly 21 interposed therebetween. The liquid flow suppressing member 5 is moved along a guide rail 54 in a section from the home position to a use position. The guide rail 54 is a linear guide extending in the X direction, and the liquid flow suppressing member 5 is moved when sliders of moving substrates 53A and 53B slid on this rail 54.

At the use position, the liquid flow suppressing member 5 is positioned with respect to a height where it is brought into contact with a surface of a liquid film of the developer formed on the upper surface of the wafer W. Since a target value of a thickness of the developer is, e.g., 0.5 to 3.0 mm, the liquid flow suppressing member 5 is positioned with respect to the height corresponding to this target value by controlling an operation of an elevating mechanism for the moving substrates 53A and 53B.

Figure 7A:
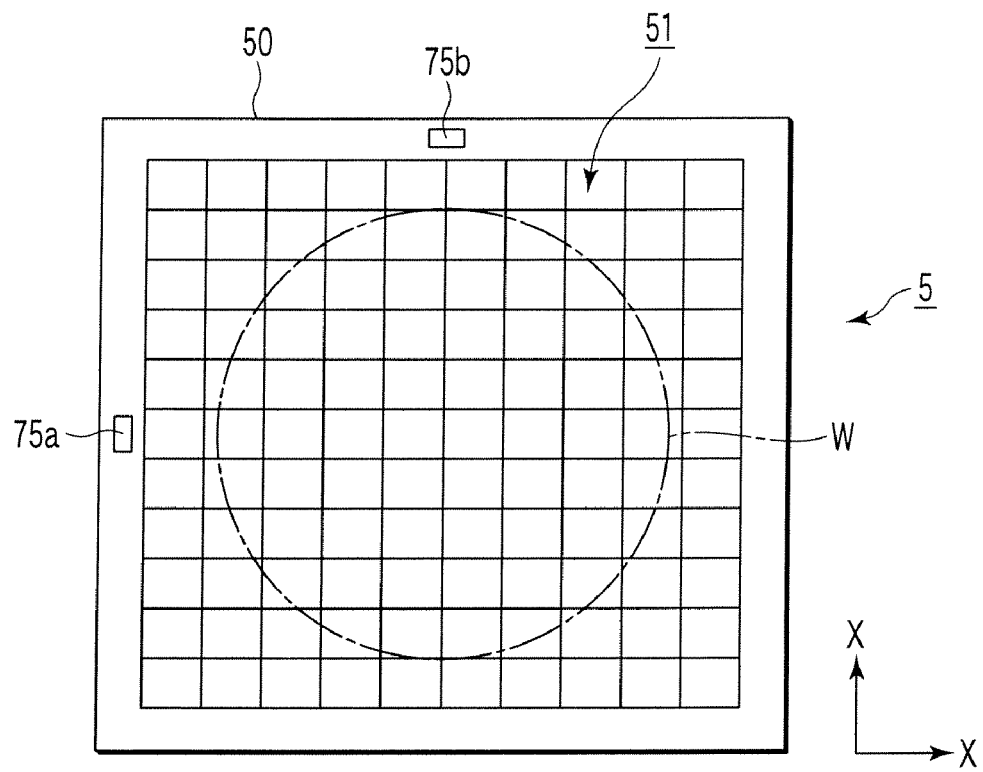
FIG. 7A is a plan view showing the liquid flow suppressing member.
Figure 7B:
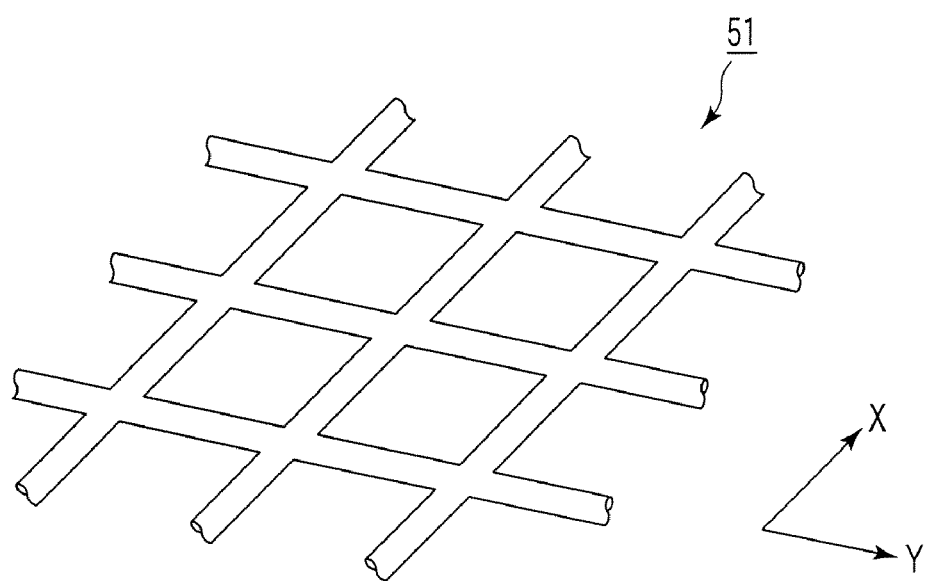
FIG. 7B is a perspective view showing a part of the liquid flow suppressing member in an enlarging manner.

As shown in FIG. 7A, the liquid flow suppressing member 5 is provided with an outer frame 50 having a plane angular shape with a width (a length from an outer rim to an inner rim) of, e.g., 10 to 30 mm and a thickness of, e.g., 10 to 30 mm. A mesh 51 which is equal to or larger than an effective region of the wafer W is provided in an inner opening region of this outer frame 50 to face the surface of the wafer W. The mesh 51 is formed into a net-like shape by arranging wires each having a diameter of, e.g., 0.1 to 1.0 mm in a front-and-back direction (the X direction) and a left-and-right direction (the Y direction) at intervals, and each of a width and a length of a region (an opening portion) surrounded by the wires adjacent to each other is set to, e.g., 0.2 to 1.0 mm. Here, each opening portion of the mesh 51 is illustrated to be larger than an actual size for the convenience's sake. It is to be noted that FIGS. 7A and 7B show that each opening portion of the mesh 51 has a square shape, but the opening portion does not have to necessarily have a square shape, and it may have, e.g., a rectangular shape, a rhombic shape or a triangular shape in some cases. That is, an arrangement direction of the wires is not restricted to a particular one as long as a size of each opening portion is formed to be equal to the size mentioned above by using the wires each having a line diameter of 0.1 to 1.0 mm.

Incidentally, it is preferable for the mesh 51 to have no flexure in a thickness direction in a plane thereof or preferable to suppress a flexure to be not greater than 0.3 mm if such a flexure exists. According to such a structure, the mesh 51 can be uniformly brought into contact with the surface of the developer within the plane thereof. Further, a cross section of the wire is not restricted to a circular shape, and the wire may be formed with a cross section having, e.g., an elliptic shape, an angular shape or a triangular shape.

One, two or more types of resin materials selected from a group consisting of, e.g., polyethylene (PE), perfluoroalkoxyethylene (PFA) and polytetrafluoroethylene (PTFE) are used for the mesh 51. Furthermore, a wire surface of the mesh 51 is subjected to a surface treatment (e.g., a treatment to provide hydrophilicity) in such a manner that a contact angle of the developer becomes, e.g., less than 30 degrees. This treatment to provide hydrophilicity is carried out by, e.g., plasma exposure or UV exposure, but the treatment to provide hydrophilicity does not have to be carried out when a selected material has the predetermined contact angle. Moreover, although a material of the mesh 51 is not restricted to a resin alone, it is preferable to select a material having the corrosion resistivity with respect to alkali since the developer is alkaline. Additionally, the same material as the mesh 51 is selected for the outer frame 50.

In the liquid flow suppressing member 5, the rear surface at one side edge of the outer frame 50 and the rear surface at the other side edge positioned to face the one side edge are detachably supported by a pair of arms 52A and 52B. A proximal end side of each of the arms 52A and 52B is supported by the moving substrate 53A or 53B. Each of the moving substrates 53A and 53B includes a non-illustrated elevating mechanism therein, whereby the liquid flow suppressing member 5 is moved up and down in a horizontal attitude. Further, each of the moving substrates 53A and 53B is slid along the guide rail 54 by a non-illustrated driving mechanism.

In this embodiment, the pair of arms 52A and 52B, the moving substrates 53A and 53B and the guide rail 54 constitute a moving mechanism which moves the liquid flow suppressing member 5 between the use position and the home position. The home position of the liquid flow suppressing member 5 is a cleaning position at which the liquid flow suppressing member 5 is cleaned. However, the cleaning position does not have to be matched with the home position, and the cleaning position may be different from the home position. For example, when the liquid flow suppressing member 5 is set in a standby mode at a position above the wafer W, the cleaning position must be provided at a position different from this home position.

A cleaning mechanism which cleans the liquid flow suppressing member 5 will now be described.

Figure 6:
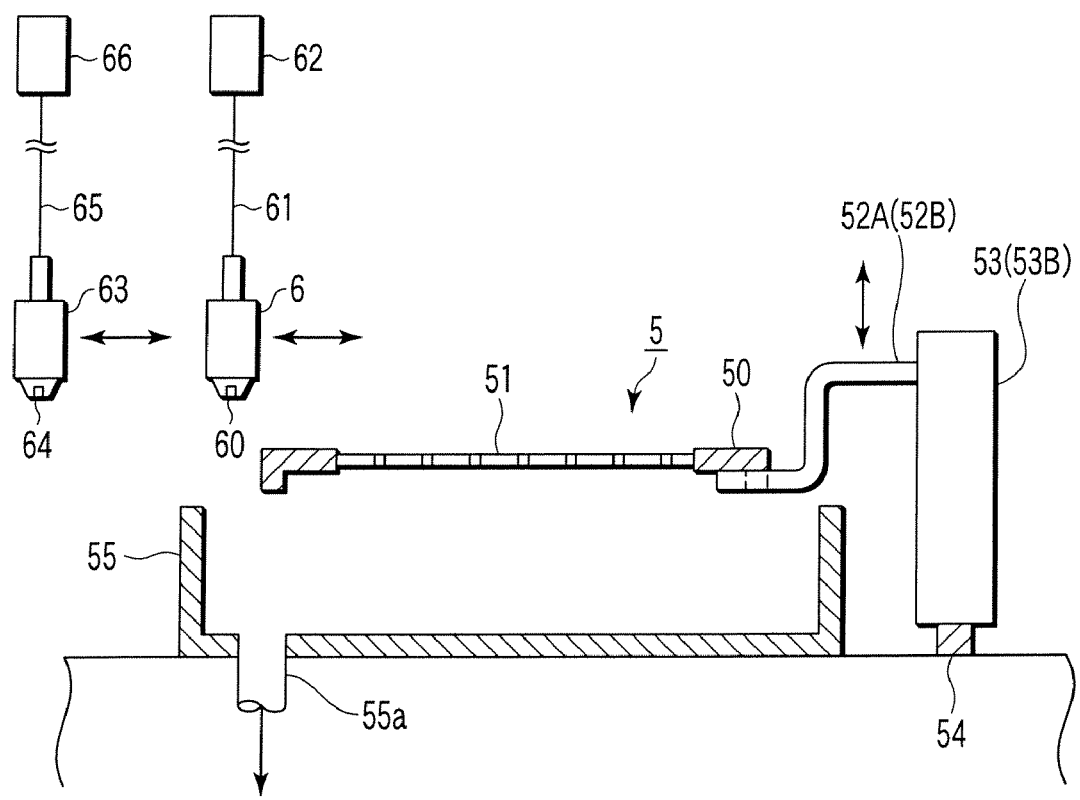
FIG. 6 is a block cross-sectional view showing cleaning means for cleaning a liquid flow suppressing member.

As shown in FIGS. 4 and 6, a cleaning cup 55, a cleaning nozzle 6 and a drying nozzle 63 are provided at the home position of the liquid flow suppressing member 5. The cleaning cup 55, cleaning nozzle 6 and drying nozzle 63 constitute a cleaning mechanism. The cleaning cup 55 has a box-like shape having side walls on four sides and an opened upper portion, and is one size larger than the liquid flow suppressing member 5 as seen from the XY plane. The liquid flow suppressing member 5 is arranged immediately above the cleaning cup 55 in a state where it is horizontally supported by the pair of arms 52A and 52B, and cleaned by using the rinse agent sprayed from the cleaning nozzle 6. A discharge opening 55a is provided at a bottom of the cleaning cup 55, and a cleaning waste liquid is discharged into a drain tank (not shown) through the discharge opening 55a.

The cleaning nozzle 6 communicates with the pure water supply source 61 through a flexible tube 61 having flexibility, and supported by a moving substrate 68A to allow its movement in the respective X, Y and Z directions. A discharge opening 60 of the nozzle is a plurality of strings of narrow holes or a slit hole. The pure water supply source 62 includes a non-illustrated pressure control valve therein. Moreover, a non-illustrated mass flow controller (MFC) is provided at an appropriate position of the flexible tube 61 so that a flow quantity of pure water supplied to the cleaning nozzle 6 is controlled. Operations of the pressure control valve, MFC and moving substrate 68A are controlled by the controller 90, respectively.

The drying nozzle 63 communicates with a drying air supply source 66 through a flexible tube 65 having flexibility, and is supported by a moving substrate 68B to allow its movement in the respective X, Y and Z directions. A discharge opening 64 of the nozzle is a string of narrow holes. The drying air supply source 66 includes a non-illustrated pressure control valve. Additionally, a non-illustrated mass flow controller (MFC) is provided at an appropriate position of the flexible tube 65 so that a flow quantity of drying air supplied to the drying nozzle 63 is controlled. Operations of these pressure control valve, MFC and moving substrate 68B are controlled by the controller 90, respectively.

The cleaning nozzle 6 and drying nozzle 63 are independently supported by the arms 67A and 67B, respectively. A proximal end side of each of the arms 67A and 67B is connected with each of the moving substrates 68A and 68B. Further, each of the moving substrates 68A and 68B is provided with a non-illustrated elevating mechanism, whereby the nozzles 6 and 63 can be independently moved up and down. Furthermore, the moving substrates 68A and 68B are supported by a guide rail 69 provided at a bottom of the apparatus, and independently slidably supported by a non-illustrated driving mechanism.

The controller 90 has a predetermined process recipe as a database, and controls operations of respective portions in the development apparatus based on this recipe. For example, in case of changing a target value of a thickness of the liquid film of the developer in accordance with a type of a resist, a set value of a height of the liquid flow suppressing member 5 is determined in accordance with the target value of the thickness of the developer, thereby storing the height set value data in the controller 90. When processing the wafer W which is, e.g., a leading wafer in a lot, the controller 90 can read this data to adjust a height of the liquid flow suppressing member 5.

A description will now be given as to a method of developing a pattern exposure latent image of a resist coating film by using the apparatus according to the present invention with reference to FIGS. 4 to 11B.

After exposure, the wafer W is carried into the development unit DEV by the main carriage arm mechanism A3, and the wafer W is horizontally held on the vacuum chuck 2 (step S1). At this time, the respective nozzles 3, 33 and 36 and the liquid flow suppressing member 5 are set at their home positions.

The liquid flow suppressing member 5 is slid from the home position to the use position, moved down at the use position, and positioned to a height at which a distance between itself and the upper surface of the wafer W becomes 0.5 to 3.0 mm (step S2). Then, the development nozzle 3 is slid from the home position to the use position, moved down at the use position, and positioned with respect to a position which is, e.g., 0.2 to 1.0 mm distanced from the upper surface of the liquid flow suppressing member 5 and is also a discharge start position slightly apart from one end edge of the wafer W on the outer side.

Figure 11A:
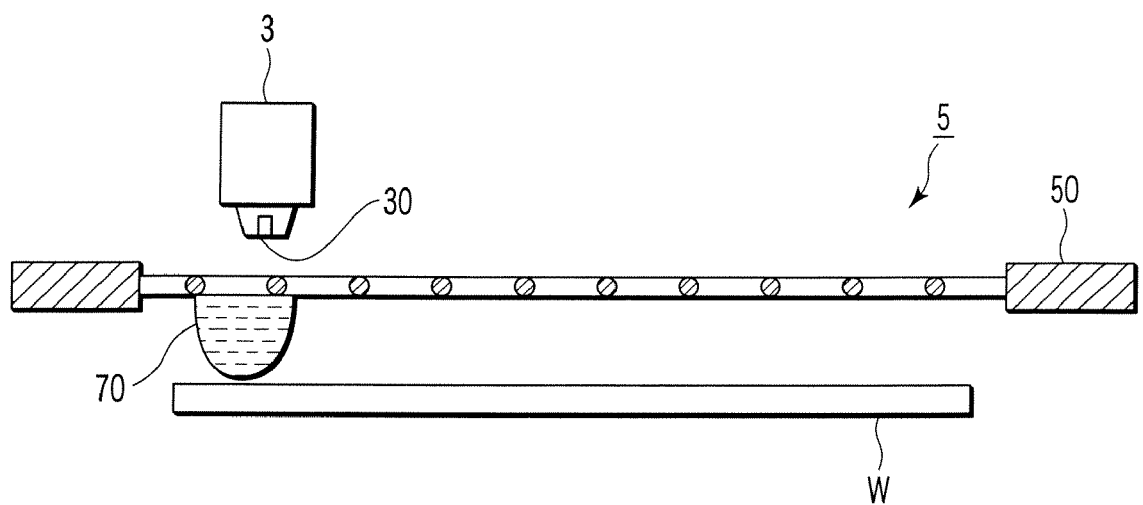
FIG. 11A is a schematic view showing a state of a nozzle, a mesh and a wafer at the time of start of development.
Figure 11B:
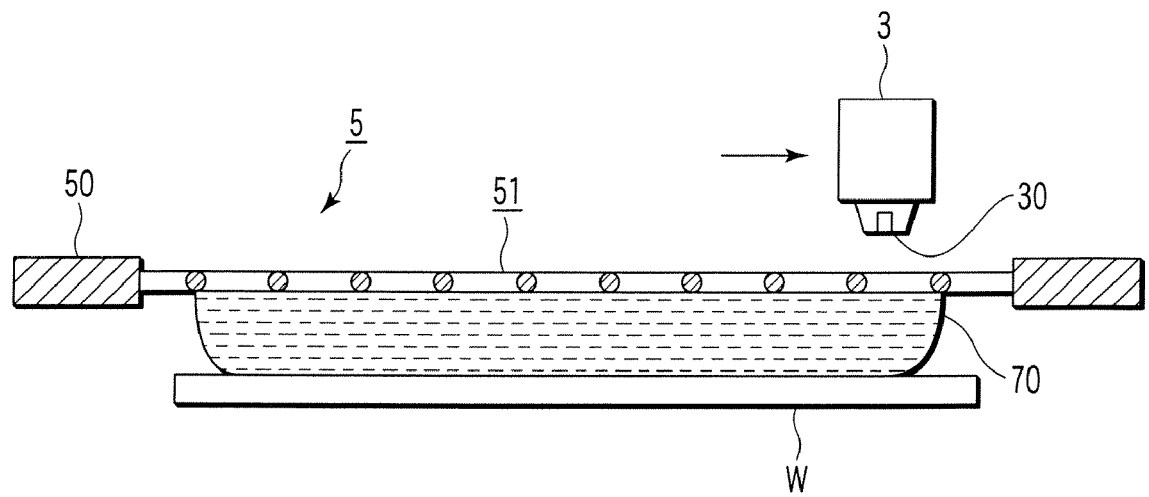
FIG. 11B is a schematic view showing a state of the nozzle, the mesh and the wafer during development.

Subsequently, as shown in FIG. 11A, the developer 70 is discharged from the nozzle 3 onto the wafer W, and the nozzle 3 is moved for scanning from one end toward the other end of the wafer W at a predetermined moving speed. Synergistic effects such as a discharging pressure, an empty weight, an acceleration and others of the developer 70 are coupled with each other, and the developer 70 is seepingly transmitted through the net openings of the mesh 51 and supplied onto the surface of the wafer W. Consequently, as shown in FIG. 11B, a liquid film of the developer 70 is formed in a gap between the wafer W and the mesh 51. A state where this liquid film is formed is maintained for a predetermined time, thereby developing a pattern latent image of a resist coating film (step S3). As the developer according to this embodiment, an aqueous solution which has 2.38 mass % of tetramethylammonium hydroxide (TMAH; $N(CH_3)_4OH$) is used. Besides, as other developers, it is possible to use one of a choline developer ($N(CH_3)_3(C_2H_4OH)OH$), NMD-W (a product name of Tokyo Ohka Kogyo Co., Ltd), NMD-3 (a product name of Tokyo Ohka Kogyo Co., Ltd) and AD10 (a product name of Tama Kagaku Kogyo Co., Ltd).

After the development processing, the development nozzle 3 stops discharge of the developer, and is then retracted to the opposite side of the home position. Subsequently, the rinse nozzle 33 moves to the use position from the home position, and is positioned with respect to the wafer W. The rinse agent is discharged from the nozzle 33, and the nozzle 33 is moved for scanning from one end of the wafer W to the other end of the same. The rinse agent is also transmitted through the mesh 51 to be supplied to the wafer W like the developer, whereby the rinse agent substitutes for the developer which has adhered to the wafer W and the liquid flow suppressing member 5 (step S4). It is to be noted that, when performing cleaning once cannot provide sufficient substitution of the developer, the rinse nozzle 33 may be reciprocated to effect cleaning twice, and cleaning may be repeated three to six times. After cleaning, discharge of the rinse agent is stopped, and the nozzle 33 is temporarily retracted to the opposite side of the home position.

On the other hand, simultaneously with supply of a cleaning liquid from the rinse nozzle 33, drying air is sprayed to the rear surface of the wafer W from the gas spraying mechanisms 130 to 132 to prevent the cleaning liquid from running toward the rear side of the wafer W. It is to be noted that a timing of spraying drying air to the rear surface of the wafer W may be after start of discharge of the cleaning liquid from the rinse nozzle 33, may be after end of discharge of the cleaning liquid from the rinse nozzle 33, or may be the same as or after start of spraying drying air from the drying nozzle 36.

Subsequently, the liquid flow suppressing member 5 is retracted to the home position (step S5). At the home position, cleaning processing of the liquid flow suppressing member 5 is carried out. The liquid flow suppressing member 5 is arranged in the cleaning cup 55 in a state where it is supported by the arms 52A and 52B. Then, the cleaning liquid is discharged from the cleaning nozzle 6, and the cleaning nozzle 6 is slid in a state where it is slightly raised from the liquid flow suppressing member 5. As a result, the liquid flow suppressing member 5 is cleaned. Then, drying air is discharged to the liquid flow suppressing member 5 from the drying nozzle 63, and the drying nozzle 63 is moved for scanning in a state where it is slightly raised from the surface of the liquid flow suppressing member 5. This drying air is adjusted to have a desired temperature and desired humidity. Consequently, the liquid flow suppressing member 5 is dried (step S8). It is to be noted that a drying nitrogen gas may be used in place of drying air.

After the liquid flow suppressing member 5 is retracted, the drying nozzle 36 is moved to the use position from the home position and positioned with respect to the wafer W and the liquid flow suppressing member 5. The drying nozzle 36 is moved for scanning in the X direction, and drying air is sprayed to the wafer W and the liquid flow suppressing member 5 to dry the wafer W and the liquid flow suppressing member 5 (step S6). The drying nozzle 36 is returned to the home position. Incidentally, it is preferable for step S8 of drying the liquid flow suppressing member 5 to be executed simultaneously with step S6 of drying the wafer W. After drying, the wafer W is carried out from the development unit DEV by the main carriage arm mechanism A3 (step S7). Further, the wafer W is accommodated in the carrier C1, and carried out from the coating/development apparatus together with the carrier C1. After carrying out the wafer W, the development nozzle 3 and the rinse nozzle 33 are returned from temporary retracting positions to the home positions, respectively.

According to this embodiment, since the mesh 51 can be used to press and hold the surface of the developer on the wafer W, thereby suppressing occurrence of a liquid flow development (flowage) in the developer. As a result, it is possible to maintain a state in which a concentration of the developer is uniform within a plane, thus improving the in-plane uniformity of the line width.

Furthermore, according to this embodiment, since the mesh 51 has the excellent wettability of the developer, the developer can be rapidly and uniformly transmitted through the mesh 51. Therefore, a developer film having a uniform thickness can be formed on the surface of the wafer W, thus executing the development processing with the high in-plane uniformity.

In recent years, since miniaturization of a device circuit has further advanced, a line width of a resist pattern is narrowed and a pattern density is increased, which results in a tendency that a shorter wavelength of exposure light is selected. Therefore, since light for exposure cannot be transmitted to a bottom in a conventionally used resist and occurrence of an exposure defect is concerned, a countermeasure of applying a resist with high degree of transparency through which light can be further readily transmitted has been examined. In resists having a high degree of transparency, there are many resists having water-shedding properties with respect to a developer, e.g., a contact angle of 80 degrees or above with respect to a developer, and hence a liquid film is repelled by the surface of the wafer W when trying reducing a thickness of such a liquid film and the liquid cannot be mounted with a uniform thickness within a plane, whereby there is a concern that reducing a thickness of the liquid film is difficult with respect to such a water-shedding resist.

However, in the liquid flow suppressing member 5 according to this embodiment, since a material having hydrophilicity which is less than 30 degrees with respect to the developer is adopted for the mesh 51, the developer can be readily spread in the XY plane, and a distribution of a part to which the developer is applied and a part to which the developer is not applied is rarely produced in the plane even if a small amount of the developer is mounted on the wafer. Since the developer is generally expensive because, e.g., recycling is difficult, setting a target value of a thickness of the liquid film to, e.g., 0.5 mm to reduce consumption of the developer can obtain an advantage that cost can be decreased.

Moreover, when the mesh 51 is formed of a wire having a small line diameter, a difference in thickness of the developer is hardly produced between given parts of the wire even if the developer reaches the inner side of the opening portions of the mesh 51 by the surface tension at the time of mounting the developer. Therefore, even if the developer is formed with a thin film thickness of, e.g., 0.5 mm, the developer having the uniform thickness in the plane of the wafer W can be formed, thus reducing consumption of the developer.

It is to be noted that the plurality of liquid flow suppressing members 5 having different wire diameters and opening portion sizes (openings of the mesh) may be prepared so that these liquid flow suppressing members 5 can be replaced in accordance with types of developers to be supplied to the wafer W, for example. Specifically, the liquid flow suppressing member 5 having large openings is used in case of a developer with small surface tension and, on the contrary, the liquid flow suppressing member 5 having small openings is used in case of a developer with large surface tension.

Further, in the foregoing embodiment, the timing of retracting the liquid flow suppressing member 5 is not restricted to a timing after cleaning the wafer W by using the rinse nozzle 33, and the liquid flow suppressing member may be retracted after supplying the developer to the wafer W and before supplying the rinse agent. In such a case, the same effect as that described above can be obtained.

Figure 12:
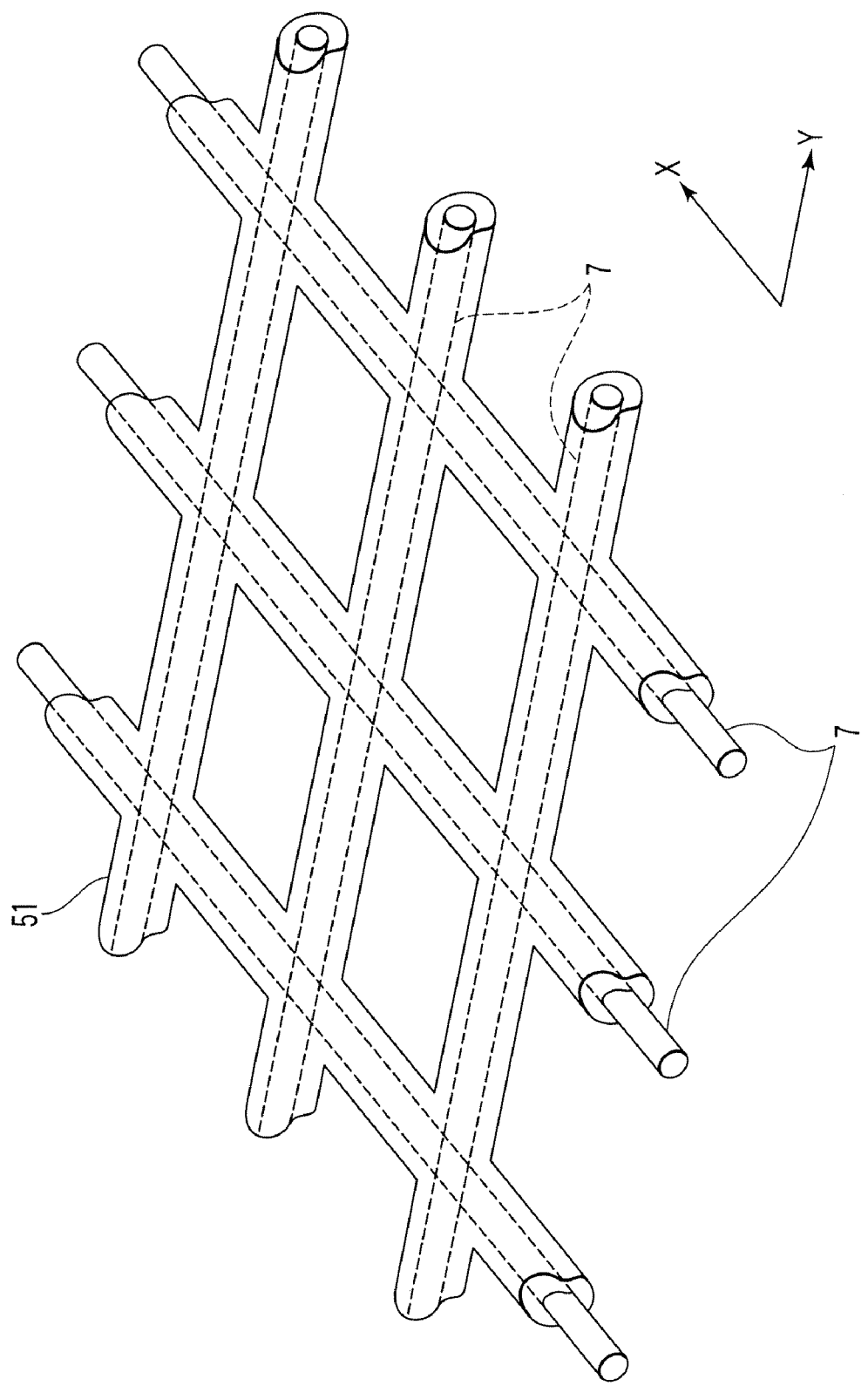
FIG. 12 is a perspective view showing a liquid flow suppressing member according to another embodiment.

In the present invention, the mesh 51 is not restricted to the configuration consisting of a resin alone and, for example, as shown in FIG. 12, a resistance heat generator, e.g., a metal wire 7 consisting of copper, stainless or a nichrome wire may be inserted into a wire formed of, e.g., a resin and a current may be supplied to the metal wire 7 from a power supply (not shown) through a wiring line (not shown) so that the mesh 51 is heated by a function of Joule heat. A heating temperature is set to a temperature at which, e.g., a development reaction is facilitated, e.g., 40 to 60° C. Even in such a case, the same effect as that described above can be obtained. It is to be noted that a surface of the metal wire 7 may be coated with a resin to form the mesh 51, or the metal 51 may be formed by using an electroconductive material (e.g., electroconductive ceramics).

Furthermore, the present invention is not restricted to the configuration which heats the mesh 51, and a predetermined voltage may be applied to the mesh 51 to form an electric field, for example. Since a resist dissolving component in the developer is pulled by this electric field and the resist dissolving component can be drawn apart from the wafer W, it is possible to suppress the development reaction from non-uniformly advancing in the XY plane. That is, since the resist dissolving component exists in the developer in a state where it is electrically charged in accordance with its polarity, providing the electric field to the mesh 51 in such a manner that, e.g., a function of an attracting force can be obtained can control these behaviors. Moreover, even if particles are mixed in the developer due to an unexpected matter, the same effect can be obtained.

Additionally, as shown in FIG. 7A, ultrasonic oscillators 75a and 75b may be disposed to the outer frame 50 of the liquid flow suppressing member 5 so that these oscillators oscillate at a predetermined timing. In this case, for example, after mounting the developer on the surface of the wafer W, the wafer W is maintained in a static state for a fixed time, e.g., 10 seconds, and then the ultrasonic oscillators 75a and 75b oscillate for, e.g., 10 seconds. When the mesh 51 is oscillated at a predetermined timing in this manner, the developer on the wafer W can be agitated, and a concentration of the resist dissolving component can be uniformed, thus increasing a pattern resolving speed.

Figure 13:
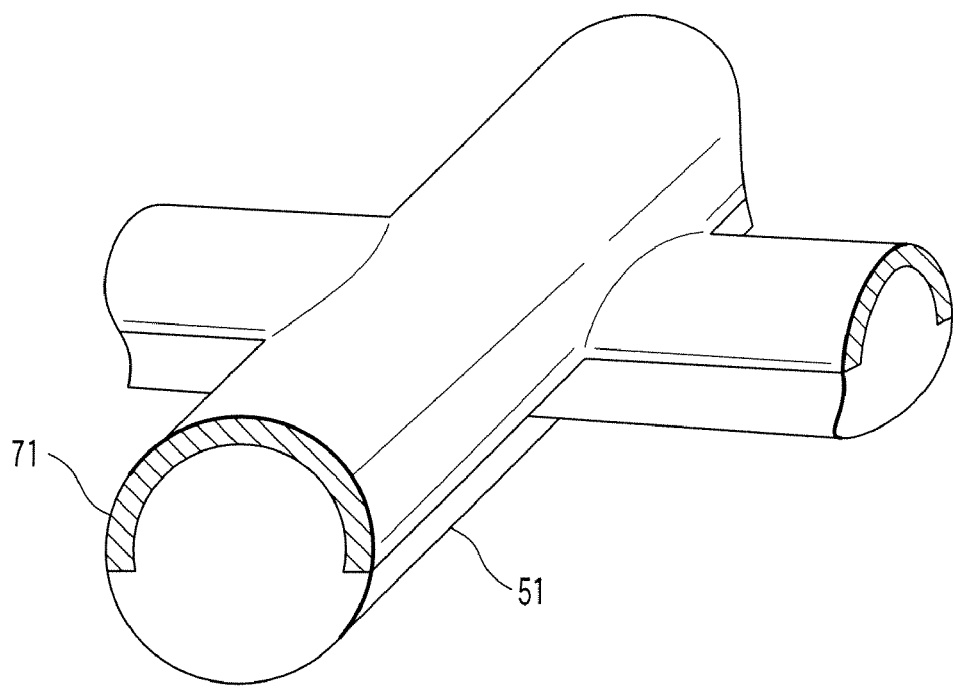
FIG. 13 is a perspective view showing a part of the liquid flow suppressing member according to another embodiment in an enlarging manner.

Although the entire surface of the mesh 51 has hydrophilic properties in the foregoing embodiment, the present invention is not restricted thereto. For example, as shown in FIG. 13, when an upper semicircular surface of the mesh 51 is subjected to hydrophobicity providing processing, a hydrophobic surface 71 (second mesh portion) having a developer contact angle of 70 degrees or above can be formed. It is to be noted that the contact angle of a hydrophilic surface (first mesh portion) on a lower semicircular surface is set to be less than 30 degrees as mentioned above. According to this structure, a liquid flow of the developer can be suppressed, and the same effect as that described above can be obtained.

Figure 14:
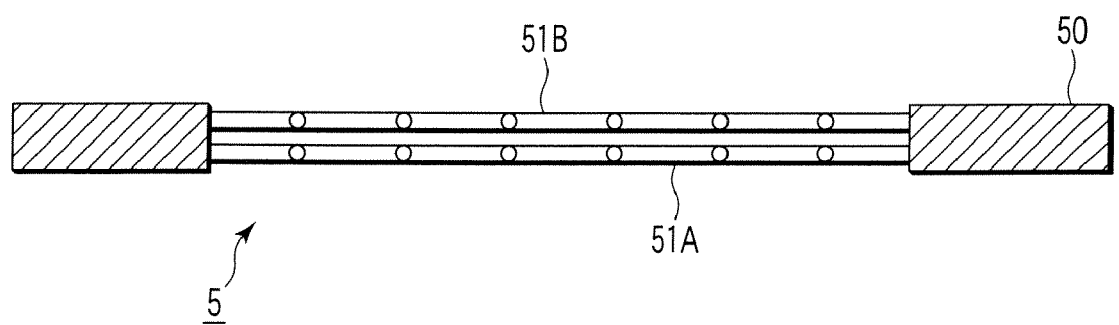
FIG. 14 is a cross-sectional view showing the liquid flow suppressing member according to another embodiment.

Additionally, the developer which is to be pulled toward the lower surface side having the hydrophilic properties can be pushed by the hydrophobic surface from above to be transmitted toward the rear surface side, and the developer which has been once transmitted is repelled by the hydrophobic surface to be pressed against the surface of the wafer W, thereby further assuredly suppressing a liquid flow of the developer. It is to be noted that the present invention is not restricted to the structure in which the upper surface of the mesh 51 is subjected to the hydrophobicity providing processing to form the hydrophobic surface 71, and it is also possible to adopt a structure in which a first mesh 51A (first mesh portion) subjected to the hydrophilicity providing processing and a second mesh 51B (second mesh portion) subjected to the hydrophobicity providing processing are aligned and provided as shown in FIG. 14, for example.

Figure 15:
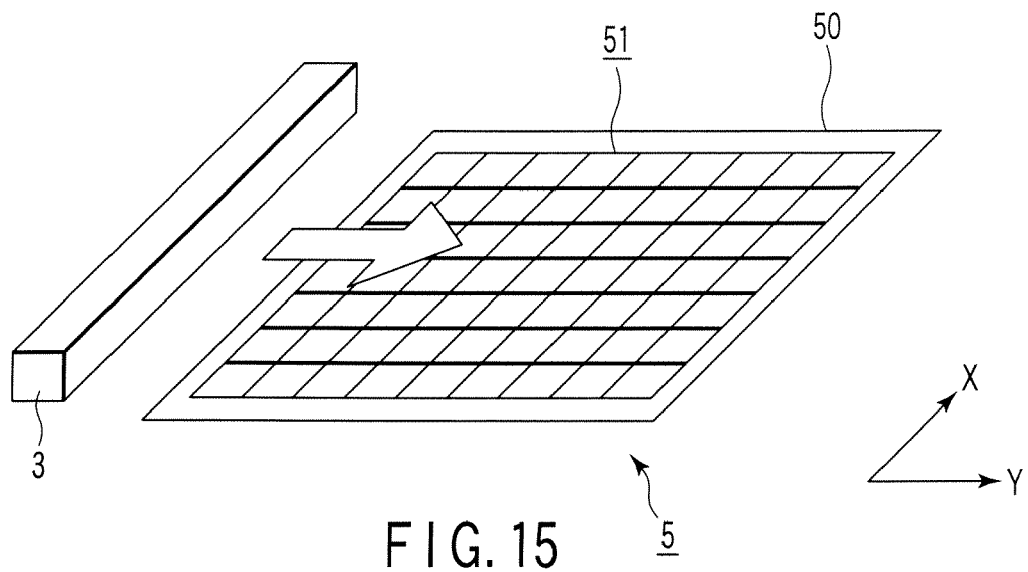
FIG. 15 is a perspective view showing the liquid flow suppressing member and a development nozzle according to another embodiment.

Further, in the present invention, the mesh 51 is not restricted to the structure in which the wires having the same line diameter are aligned in the front-and-back direction (X direction) and the left-and-right direction (Y direction). For example, as shown in FIG. 15, a wire diameter of the wire extending in a scanning direction (Y direction) of the development nozzle 3 may be set larger than that of the wire extending in the lateral direction. Even if such a configuration is adopted, a liquid flow of the developer can be suppressed to obtain the same effect as that mentioned above. Furthermore, according to the present invention, since strength of the mesh 51 can be improved by increasing the wire diameter, it is possible to suppress occurrence of slack at the central part of the mesh 51. It is to be noted that the present invention is not restricted to the structure in which wire diameters of all the wires extending in the nozzle moving direction (Y direction) are increased, and a wire with a large diameter may be arranged at every several rows to every several-ten rows. That is, a large-diameter wire having a large diameter can be included in one or both the X direction and the Y direction, and this large-diameter wire having a large diameter can be arranged every predetermined number of rows (e.g., every three rows) may be increased.

Moreover, the present invention is not restricted to the structure in which a wire diameter of the wire extending in the scanning movement direction of the development nozzle 3 is increased as mentioned above, and a wire diameter of the wire extending in a length direction of the development nozzle 3.

Figure 16:
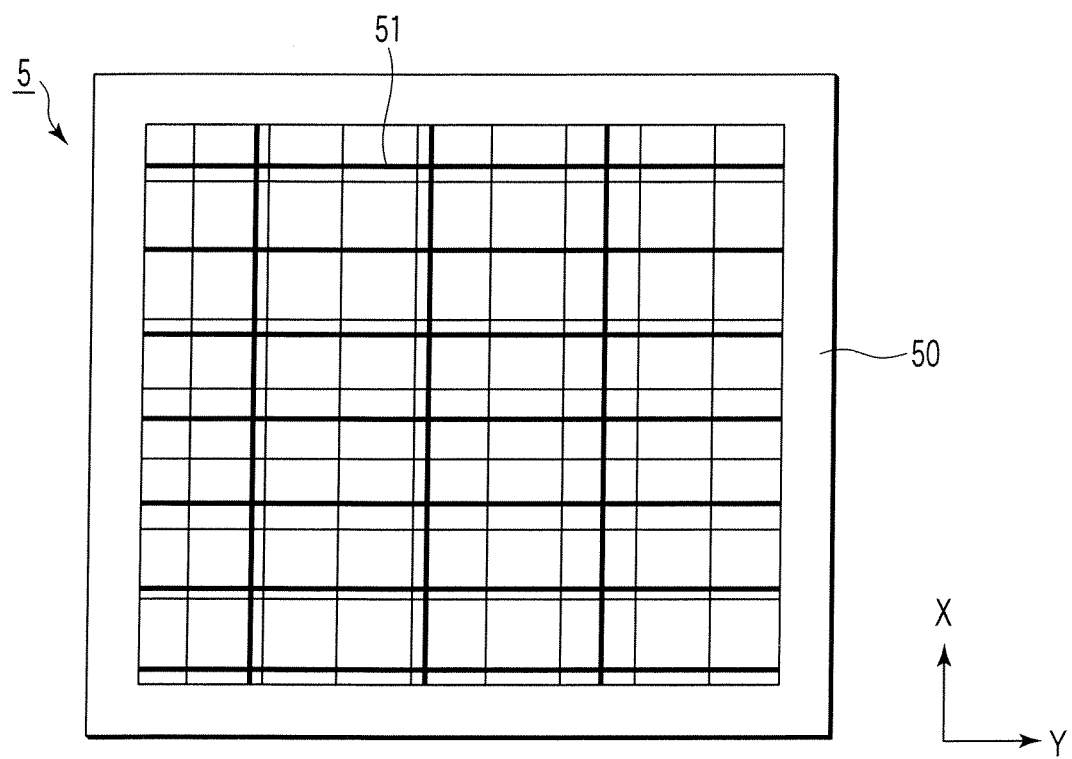
FIG. 16 is a plan view showing the liquid flow suppressing member according to another embodiment.

Additionally, as shown in FIG. 16, arrangement intervals of the wire having a large diameter may be changed depending on the front-and-back direction and the left-and-right direction. Specifically, there is an example in which an arrangement interval of the wire having a large wire diameter is narrowed in the scanning direction and an arrangement interval is widened in the width direction. Even in such a case, the strength of the mesh 51 can be assured to obtain the same effect as that mentioned above.

Further, the present invention is not restricted to the structure in which sizes of opening portions of the mesh 51, i.e., openings of the mesh are made uniform within a plane, and it is possible to adopt a structure in which a distribution of a part having large openings and a part having small openings is provided within a plane. Specifically, as shown in FIG. 17, openings in a part corresponding to the outside of the wafer W are set larger than openings in a part facing the surface of the wafer W. Even if such a configuration is adopted, a liquid flow of the developer can be suppressed to obtain the same effect as that mentioned above. Furthermore, in this example, since the openings in the part positioned outside the wafer W are increased in size, the developer from the discharge opening 30 protruding to the outside of the wafer W is rapidly transmitted through the mesh 51 and falls. That is, since it is possible to suppress a state in which the developer has adhered to and remains on the surface of the mesh 51 positioned on the outside of the wafer W, the developer on the surface of the wafer W is rarely pulled by the developer existing on the outside to produce a liquid flow.

Moreover, in the present invention, as shown in FIG. 18, an auxiliary plate 73 whose size is equal to or larger than that of the liquid flow suppressing member 5 may be provided, for example. The auxiliary plate 73 has a rectangular outer peripheral shape, and its central part is circularly cut out. The wafer W enters a circular cutout portion of this auxiliary plate 73, and a small gap is formed between the outer peripheral end surface of the wafer W and the auxiliary plate 73 (inner peripheral end surface of the circular cutout portion). In this state, the auxiliary plate 73 is level with the wafer W and the auxiliary plate 73 surrounds the wafer W, and hence a liquid falling from the wafer W is received by the auxiliary plate 73. This auxiliary plate 73 is subjected to a surface treatment to have a contact angle of, e.g., 40 to 70 degrees with respect to the developer.

Even if such an auxiliary plate 73 is used, not only the same effect as that mentioned above can be obtained, but also a liquid flow can be suppressed from being generated in the liquid film when the developer on the surface of the wafer W is pulled by the falling developer by using the auxiliary plate 71 to receive the developer discharged from the discharge opening 30 protruding on the outside of the wafer W. However, when a contact angle with respect to the surface of the auxiliary plate 73 is too small, a tensile force of the auxiliary plate 73 is not enough, and hence a liquid flow may be generated on the surface of the auxiliary plate 73 and the developer on the surface of the wafer W may be pulled by this flow in some cases. On the contrary, when the contact angle is too large, the tensile force of the auxiliary plate 73 is too strong, and the developer on the surface of the wafer W is pulled. For these reasons, it is preferable to set the surface tension of the auxiliary plate 73 to 40 to 70 degrees.

Figure 19:
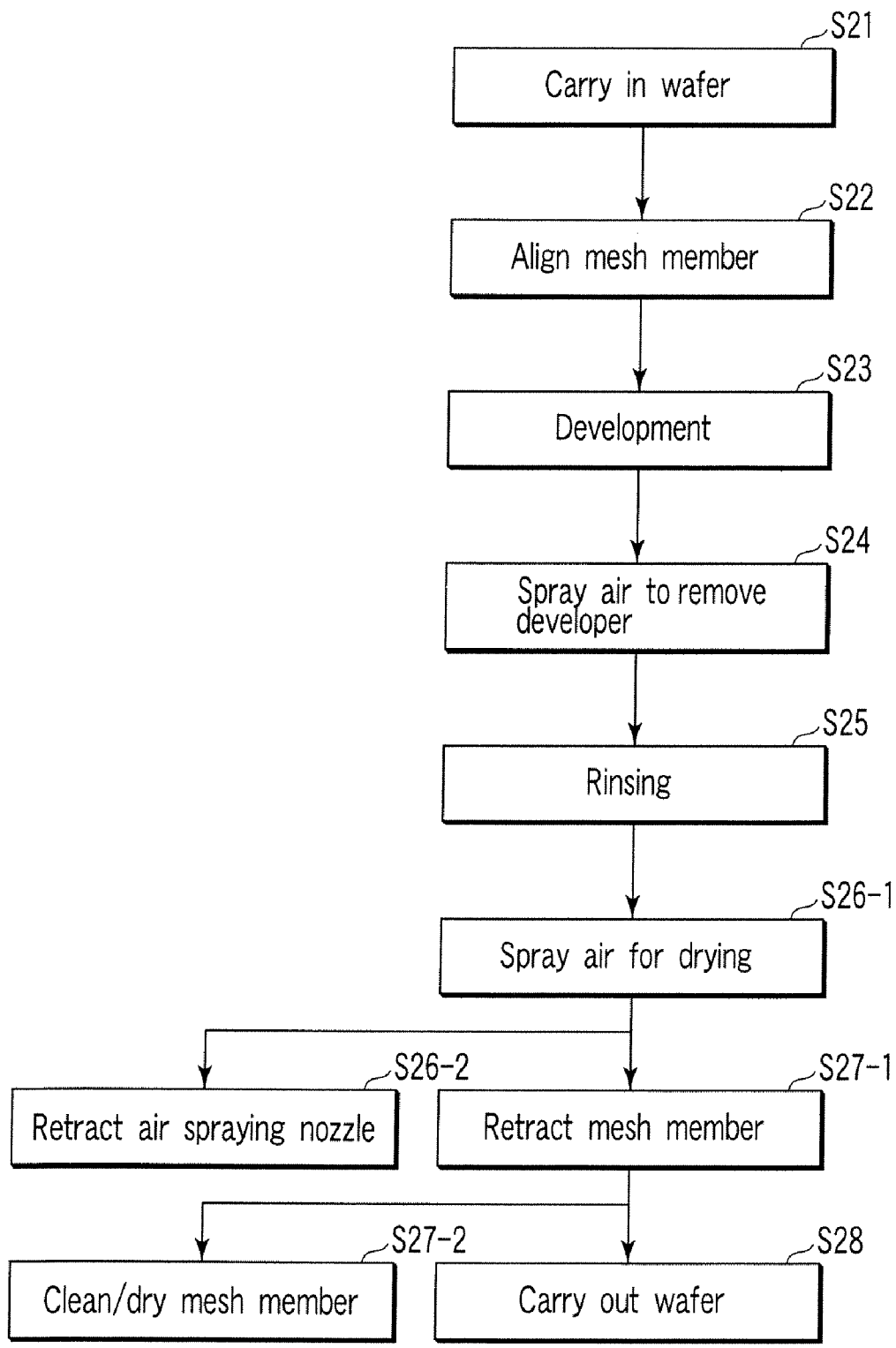
FIG. 19 is a flowchart showing a development method according to another embodiment.

A development method according to another embodiment of the present invention will now be described with reference to FIG. 19.

After exposure, the wafer W is carried into the development unit DEV by the main carriage arm mechanism A3, and the wafer W is horizontally held on the vacuum chuck 2 (step S21). At this time, the respective nozzles 3, 33 and 36 and the liquid flow suppressing member 5 are placed at their home positions.

The liquid flow suppressing member 5 is slid from the home position to the use position, moved down at the use position, and positioned with respect to a height where a distance between itself and the upper surface of the wafer W becomes 0.5 to 3.0 mm (step S22). Then, the development nozzle 3 is slid from the home position to the use position, moved down at the use position, and positioned with respect to a position which is, e.g., 0.2 to 1.0 mm distanced from the upper surface of the liquid flow suppressing member 5 and is a discharge start position slightly apart from one end edge of the wafer W on the outer side.

Subsequently, as shown in FIG. 11A, the developer 70 is discharged from the nozzle 3 toward the upper surface of the wafer W, and the nozzle 3 is moved for scanning from one end toward the other end of the wafer W at a predetermined moving speed. As a result, as shown in FIG. 11B, a liquid film of the developer 70 is formed in a gap between the wafer W and the mesh 51. When a state in which this liquid film is formed is maintained for a predetermined time, a pattern latent image of the resist coating film is developed (step S23). As the developer according to this embodiment, NMD-W (product name of Tokyo Ohka Kogyo Co., Ltd) is used.

After development processing, the nozzle 3 stops discharging the developer and is then temporarily retracted to the opposite side of the home position. The drying nozzle 36 is moved from the home position to the use position and positioned with respect to the wafer W and the liquid flow suppressing member 5. The drying nozzle 36 is moved for scanning in the X direction, and drying air is sprayed to the wafer W and the liquid flow suppressing member 5 from the nozzle 36 to blow out and remove the developer from the wafer W and the liquid flow suppressing member 5 (step S24). The drying nozzle 36 is returned to the home position.

Then, the rinse nozzle 33 is moved from the home position to the use position, and positioned with respect to the wafer W and the liquid flow suppressing member 5. The rinse agent is discharged from the nozzle 33, and the nozzle 33 is moved for scanning from one end toward the other end of the wafer W. The rinse agent is transmitted through the mesh 51 to be supplied to the wafer W, whereby the rinse agent substitutes for the developer which has adhered to the wafer W and the liquid flow suppressing member 5 (step S25). After cleaning, discharging the rinse agent is stopped, and the rinse nozzle 33 is temporarily retracted to the opposite side of the home position.

Then, the drying nozzle 36 is moved from the home position to the use position, and positioned with respect to the wafer W and the liquid flow suppressing member 5. The drying nozzle 36 is moved for scanning in the X direction, and drying air is sprayed to the wafer W and the liquid flow suppressing member 5 from the nozzle 36 to dry both the wafer W and the liquid flow suppressing member 5 (step S26-1). The drying nozzle 36 is returned to the home position (step S26-2).

On the other hand, drying air is sprayed toward the rear surface of the wafer W from the gas spraying mechanisms 130 to 132 simultaneously with supply of the cleaning liquid from the rinse nozzle 33 to prevent the cleaning liquid from running toward to and adhering to the rear surface of the wafer W. It is to be noted that a timing of spraying drying air to the rear surface of the wafer W may be after start of discharging the cleaning liquid from the rinse nozzle 33, or may be after end of discharging the cleaning liquid from the rinse nozzle 33, or may be the same as or after start of spraying drying air from the drying nozzle 36.

Then, the liquid flow suppressing member 5 is retracted to the home position (step S27-1). At the home position, cleaning processing of the liquid flow suppressing member 5 is executed. The liquid flow suppressing member 5 is arranged in the cleaning cup 55 in a state where it is supported by the arms 52A and 52B. Subsequently, the cleaning liquid is discharged from the cleaning nozzle 6, and the cleaning nozzle 6 is slid in a state where it is slightly raised above the liquid flow suppressing member 5. As a result, the liquid flow suppressing member 5 is cleaned. Then, drying air is discharged from the drying nozzle 63 to the liquid flow suppressing member 5, and the drying nozzle 63 is moved for scanning in a state where it is slightly raised above the surface of the liquid flow suppressing member 5. This drying air has been adjusted to a desired temperature and humidity. As a result, the liquid flow suppressing member 5 is dried (step S27-2).

After drying, the wafer W is carried out from the development unit DEV by the main carriage arm mechanism A3 (step S28). Further, the wafer W is accommodated in the carrier C1 and carried out from the coating/development apparatus together with the carrier C1. After carrying out the wafer W, the development nozzle 3 and the rinse nozzle 33 are respectively returned to the home positions from the temporary retracted positions.

Figure 20:
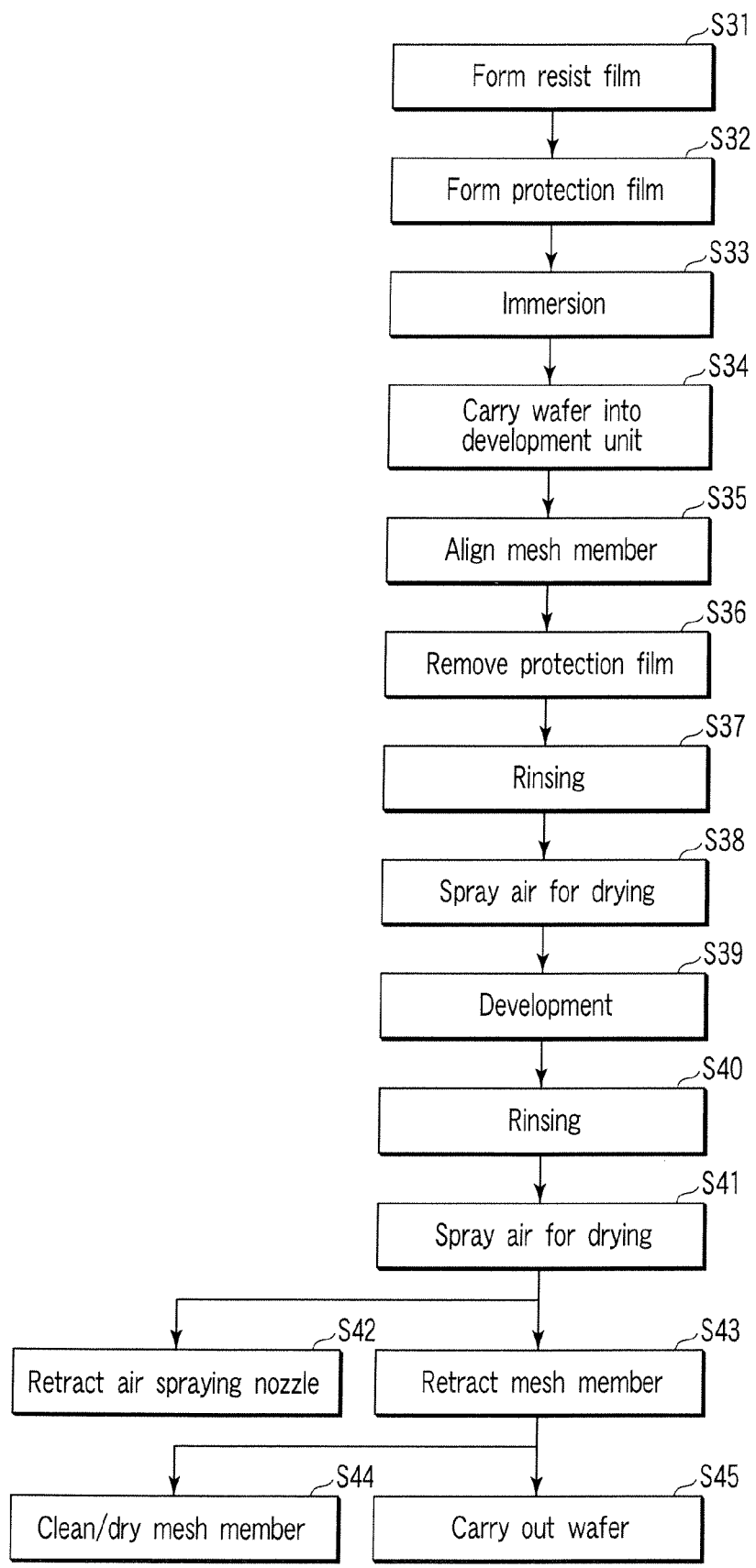
FIG. 20 is a flowchart showing the development method according to another embodiment.

A development method according to still another embodiment according to the present invention will now be described with reference to FIG. 20.

The wafer W is carried into the coating unit COT by the main carriage arm mechanism A2, and the wafer W is coated with a resist by a spin coating method to form a resist coating film having a predetermined film thickness (step S31). Furthermore, the wafer W is carried to another coating unit COT, and a process liquid having a predetermined component is applied to an upper surface of the resist film to form a protection film having a predetermined film thickness (step S32). This protection film protects the resist film in the next immersion.

After a predetermined pre-baking step, the wafer W is carried to the exposure portion B4, and the resist film is subjected to pattern exposure by immersion (step S33). An outline of a technology of immersion is introduced in a web page (http://www.nikon.co.jp/main/jpn/whatsnew/2003/immersion_03.htm) of Nikon Corporation, for example.

After immersion, the wafer W is carried into the development unit DEV by the main carriage arm mechanism A3, and the wafer W is horizontally held on the vacuum chuck 2 (step S34). At this time, the respective nozzles 3, 33 and 36 and the liquid flow suppressing member 5 exist at their home positions.

The liquid flow suppressing member 5 is slid from the home position to the use position, moved down at the use position, and positioned with respect to a height where a distance between itself and the upper surface of the wafer W becomes 0.5 to 3.0 mm (step S35). Subsequently, the development nozzle 3 is slid from the home position to the use position, moved down at the use position, and positioned with respect to a position which is, e.g., 0.2 to 1.0 mm away from the upper surface of the liquid flow suppressing member 5 and is also a discharge start position slightly apart from one end edge of the wafer W on the outer side.

Then, as shown in FIG. 11A, the developer 70 is discharged toward the upper surface of the wafer W from the nozzle 3, and the nozzle 3 is moved for scanning from one end toward the other end of the wafer W at a predetermined moving speed. As a result, as shown in FIG. 11B, a liquid film of the developer 70 is formed in a gap between the wafer W and the mesh 51. When a state where this liquid film is formed is held for a predetermined time, the protection film is removed (step S36).

Subsequently, the rinse nozzle 33 is moved from the home position to the use position, and positioned with respect to the wafer W and the liquid flow suppressing member 5. The rinse agent is discharged from the nozzle 33, and the nozzle 33 is moved for scanning from one end toward the other end of the wafer W. The rinse liquid is transmitted through the mesh 51 to be supplied to the wafer W, and the rinse agent substitutes for the developer which has adhered to the wafer W and the liquid flow suppressing member 5 (step S37). After cleaning, discharging the rinse agent is stopped, and the rinse nozzle 33 is temporarily retracted to the opposite side of the home position.

Then, the drying nozzle 36 is moved from the home position to the use position, and positioned with respect to the wafer W and the liquid flow suppressing member 5. The drying nozzle 36 is moved for scanning in the X direction, and drying air is sprayed to the wafer W and the liquid flow suppressing member 5 from the nozzle 36 to dry both the wafer W and the liquid flow suppressing member 5 (step S38). The drying nozzle 36 is returned to the home position.

Subsequently, the development nozzle 3 is slid from the home position to the use position, moved down at the use position, and positioned with respect to a position which is, e.g., 0.2 to 1.0 mm away from the upper surface of the liquid flow suppressing member 5 and is also a discharge start position slightly apart from one end edge of the wafer W on the outer side. Then, as shown in FIG. 11A, the developer 70 is discharged to the upper surface of the wafer W from the nozzle 3, and the nozzle 3 is moved for scanning from one end toward the other end of the wafer W at a predetermined moving speed. As a result, as shown in FIG. 11B, a liquid film of the developer 70 is formed in a gap between the wafer W and the mesh 51. When a state where this liquid film is formed is maintained for a predetermined time, a pattern latent image of the resist coating film is developed (step S39). As the developer according to this embodiment, AD10 (product name of Tama Kagaku Kogyo Co., Ltd) is used.

After the development processing, the development nozzle 3 stops discharging the developer, and is then temporarily retracted to the opposite side of the home position. The rinse nozzle 33 is moved from the home position to the use position, and positioned with respect to the wafer W and the liquid flow suppressing member 5. The rinse agent is discharged from the nozzle 33, and the nozzle 33 is moved for scanning from one end toward the other end of the wafer W. The rinse agent is transmitted through the mesh 51 to be supplied to the wafer W, whereby the rinse agent substitutes for the developer which has adhered to the wafer W and the liquid flow suppressing member 5 (step S40). After cleaning, discharging the rinse agent is stopped, and the rinse nozzle 33 is temporarily retracted to the opposite side of the home position.

Then, the drying nozzle 36 is moved from the home position to the use position, and positioned with respect to the wafer W and the liquid flow suppressing member 5. When the drying nozzle 36 is moved for scanning in the X direction, and drying air is sprayed to the wafer W and the liquid flow suppressing member 5 from the nozzle 36 to blow out the rinse agent which has adhered to the wafer W and the liquid flow suppressing member 5 (step S41). The drying nozzle 36 is retracted to the home position.

Subsequently, the liquid flow suppressing member 5 is retracted to the home position (step S43). At the home position, cleaning processing of the liquid flow suppressing member 5 is executed. The liquid flow suppressing member 5 is arranged in the cleaning cup 55 in a state where it is supported by the arms 52A and 52B. Then, the cleaning liquid is discharged from the cleaning nozzle 6, and the cleaning nozzle 6 is slid in a state where it is slightly raised above the liquid flow suppressing member 5. As a result, the liquid flow suppressing member 5 is cleaned. Subsequently, drying air is discharged to the liquid flow suppressing member 5 from the drying nozzle 63, and the drying nozzle 63 is moved for scanning in a state where it is slightly raised above the surface of the liquid flow suppressing member 5. This drying air has been adjusted to have a desired temperature and humidity. As a result, the liquid flow suppressing member 5 is dried (step S44).

After drying, the wafer W is carried out from the development unit DEV by the main carriage arm mechanism A3 (step S45). Moreover, the wafer W is accommodated in the carrier C1, and carried out from the coating/development apparatus together with the carrier C1. After carrying out the wafer W, the development nozzle 3 and the rinse nozzle 33 are respectively returned to the home positions from the temporary retracted positions.

The present invention is not restricted to the case where the liquid flow suppressing member 5 is arranged at a height position alone where the surface of the developer is pressed. For example, the liquid flow suppressing member 5 can be arranged at a height where a part or all of the mesh 51 is immersed in the liquid film of the developer. Even in this case, the same effect as that described above can be obtained. However, since a liquid flow (flowage) phenomenon of the developer may occur due to a small air current flowing in the apparatus in some cases, it is preferable to set a position of the liquid flow suppressing member 5 at a height where this member comes into contact with the surface of the developer.

Additionally, in the present invention the liquid flow suppressing member 5 is not restricted to a plane rectangular shape, and it may have, e.g., a circular shape, an elliptical shape or a polygonalal shape. Further, it is possible to adopt a structure in which the outer frame 50 is formed like a folding screen so that the liquid flow suppressing member 5 can be folded or can be rolled in order to reduce an occupied area in a standby mode.

Furthermore, the present invention is not restricted to the structure in which the development nozzle 3 is scanned from one end toward the other end of the wafer W, and the development nozzle 3 may be arranged in a diameter direction of the wafer W, the developer may be discharged from the discharge opening 30 and the wafer W and the liquid flow suppressing member 5 may be integrally rotated 180° around a perpendicular axis to mount the liquid, for example. Even in this case, the same effect as that described above can be obtained. Moreover, the substrate subjected to the development processing may be a substrate other than the semiconductor wafer, e.g., an LCD substrate or a reticle substrate for a photomask.

What is claimed is:

1. A development apparatus which develops a resist coating film subjected to pattern exposure on a substrate, comprising:
    a substrate holding portion which substantially horizontally holds the substrate in such a manner that the resist coating film is placed on an upper side;
    a development nozzle which supplies a developer to an upper surface of the substrate held by the substrate holding portion;
    a liquid flow suppressing member whose size in a two-dimensional plane viewing field is equal to or larger than that of the substrate, and which has a mesh having many openings and hydrophilic properties with respect to the developer, transmits the developer supplied from the development nozzle through the openings of the mesh, and forms a liquid film between the mesh and the substrate; and
    a moving mechanism which movably supports the liquid flow suppressing member, sets the mesh to face the resist coating film on the substrate, and brings the mesh into contact with the surface of the liquid film of the developer or immerses the mesh in the liquid film.

2. The apparatus according to claim 1, wherein a contact angle of the developer with respect to the mesh is less than 30 degrees.

3. The apparatus according to claim 1, wherein the resist coating film has water-shedding properties with respect to the developer, and
    a thickness of the liquid film of the developer is 0.5 to 3 mm.

4. The apparatus according to claim 1, wherein the mesh has a first mesh portion having hydrophilic properties with respect to the developer, and a second mesh portion which is provided above the first mesh portion and has hydrophilic properties smaller than the first mesh portion.

5. The apparatus according to claim 4, wherein a contact angle of the developer with respect to the second mesh portion is not smaller than 70 degrees.

6. The apparatus according to claim 1, wherein the mesh has a plurality of first wires arranged at intervals in a first direction and a plurality of second wires arranged at intervals in a second direction to cross the first wires, and
    a diameter of each of the first wires is larger than that of each of the second wires.

7. The apparatus according to claim 6, wherein the development nozzle has: a discharge opening whose length corresponds to a width of an effective area of the substrate; and
    a nozzle moving mechanism which moves the development nozzle from one end side to the other end side of the substrate, and
    the first wires extend in the same direction as a moving direction of the development nozzle whilst the second wires extend in a direction crossing the moving direction of the development nozzle.

8. The apparatus according to claim 1, wherein the mesh has a group of a plurality of first wires arranged at intervals in a first direction and a group of a plurality of second wires arranged at intervals in a second direction to cross the first wires, and large-diameter wires having a large wire diameter are included in one or both of the first and second wire groups, and each large-diameter wires is arranged every predetermined number of wires.

9. The apparatus according to claim 1, wherein openings of the mesh on a side which does not face the substrate are larger than openings of the same on a side facing the substrate.

10. The apparatus according to claim 1, further having an auxiliary plate which is provided to surround an outer periphery of the substrate held by the substrate holding portion and has smaller hydrophilic properties with respect to the developer than at least those of the mesh.

11. The apparatus according to claim 10, wherein a contact angle of the developer with respect to the auxiliary plate is 40 to 70 degrees.

12. The apparatus according to claim 1, further having cleaning means for cleaning the liquid flow suppressing member.

13. A development method which develops a resist coating film subjected to pattern exposure on a substrate, comprising:
  (a) substantially horizontally holding the substrate in such a manner that the resist coating film is placed on an upper side;
  (b) preparing a liquid flow suppressing member whose size in a two-dimensional plane viewing field is equal to or larger than that of the substrate and which has a mesh having many openings and hydrophilic properties with respect to the developer, and adjusting a position of the liquid flow suppressing member with respect to the substrate; and
  (c) transmitting the developer through the openings of the mesh, forming a liquid film of the developer between the mesh and the substrate, and holding a state in which the mesh is in contact with a surface of the liquid film of the developer or is immersed in the liquid film for a predetermined time, thereby developing the resist coating film.

14. The method according to claim 13, wherein a contact angle of the developer with respect to the mesh is less than 30 degrees.

15. The method according to claim 13, wherein the resist coating film has water-shedding properties with respect to the developer, and a supply amount of the developer is adjusted and a position of the liquid flow suppressing member is adjusted with respect to the substrate in such a manner that a thickness of the liquid film of the developer becomes 0.5 to 3 mm in step (b).

16. The method according to claim 13, further comprising cleaning the liquid flow suppressing member by using a rinse agent and spraying a drying gas to remove the rinse agent from the liquid flow suppressing member after step (c).

17. The method according to claim 13, further comprising cleaning the substrate by using a rinse agent and spraying a drying gas to remove the rinse agent from the substrate after step (c).

18. The method according to claim 13, wherein, at the time of cleaning the liquid flow suppressing member by using a rinse agent, spraying a drying gas to remove the rinse agent from the liquid flow suppressing member, cleaning the substrate with the rinse agent and spraying the drying gas to remove the rinse agent from the substrate after step (c), the method further comprises:

simultaneously performing removal of the rinse agent from the liquid flow suppressing member and removal of the rinse agent from the substrate.

19. The method according to claim 13, further comprising spraying a drying gas to remove the developer from the substrate, cleaning the substrate by using a rinse agent and further spraying the drying gas to the substrate to remove the rinse agent from the substrate after step (c).

20. The method according to claim 13, wherein the resist coating film is covered with a protection film and subjected to immersion before step (a), and the liquid flow suppressing member is utilized to remove the protection film before step (c).

\* \* \* \* \*